United States Patent
Bae et al.

(10) Patent No.: US 10,601,113 B2
(45) Date of Patent: Mar. 24, 2020

(54) ELECTRONIC DEVICE COMPRISING ANTENNA

(71) Applicant: Samsung Electronics Co., Ltd., Gyeonggi-do (KR)

(72) Inventors: Hong Pyo Bae, Gyeonggi-do (KR); Dong Yeon Kim, Gyeonggi-do (KR); Ho Jung Nam, Gyeonggi-do (KR); Sung Koo Park, Gyeonggi-do (KR); Jae Woon Park, Seoul (KR); Min Cheol Seo, Seoul (KR); Him Chan Yun, Gyeonggi-do (KR); Han Dug Lee, Gyeonggi-do (KR); Hyun Woo Lee, Gyeonggi-do (KR); Hyung Joo Lee, Gyeonggi-do (KR); Byung Man Lim, Seoul (KR); Nak Chung Choi, Seoul (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 16/125,163

(22) Filed: Sep. 7, 2018

(65) Prior Publication Data
US 2019/0074576 A1    Mar. 7, 2019

(30) Foreign Application Priority Data
Sep. 7, 2017    (KR) .......................... 10-2017-0114626

(51) Int. Cl.
*H01Q 1/24*    (2006.01)
*H01Q 1/38*    (2006.01)
(Continued)

(52) U.S. Cl.
CPC .............. *H01Q 1/243* (2013.01); *H01Q 1/38* (2013.01); *H01Q 1/526* (2013.01);
(Continued)

(58) Field of Classification Search
CPC .......... H01Q 1/24; H01Q 1/241; H01Q 1/526; H01Q 13/10; H01Q 9/0407
See application file for complete search history.

(56) References Cited

U.S. PATENT DOCUMENTS 8,102,319 B2    1/2012    Schlub et al.
8,259,017 B2    9/2012    Schlub et al.
(Continued)

OTHER PUBLICATIONS

International Search Report dated Dec. 27, 2018 issued in counterpart application No. PCT/KR2018/010496, 8 pages.

*Primary Examiner* — Hoang V Nguyen
(74) *Attorney, Agent, or Firm* — The Farrell Law Firm, P.C.

(57) ABSTRACT

An electronic device is provided. The electronic device includes a housing including a front plate, a rear plate facing away from the front plate, and a side member surrounding a space between the front plate and the rear plate, the housing including at least one antenna element extended along one portion of the side member, a display exposed through the front plate and including a display panel and a shield layer, a wireless communication circuit electrically connected to the antenna element, a support member, at least a portion of which is positioned in the space in parallel with the shield layer, and a conductive patch layer interposed between the shield layer and the support member.

20 Claims, 22 Drawing Sheets

(51) Int. Cl.
  *H01Q 13/10*  (2006.01)
  *H05K 1/02*  (2006.01)
  *H01Q 1/52*  (2006.01)
  *H01Q 9/04*  (2006.01)
  *H04M 1/02*  (2006.01)

(52) U.S. Cl.
  CPC ........... *H01Q 9/0407* (2013.01); *H01Q 13/10* (2013.01); *H04M 1/0266* (2013.01); *H05K 1/0216* (2013.01); *H05K 1/0237* (2013.01); *H04M 1/0262* (2013.01)

(56) References Cited

U.S. PATENT DOCUMENTS

| | | |
|---|---|---|
| 8,525,739 B2 | 9/2013 | Lee et al. |
| 8,952,860 B2 | 2/2015 | Li et al. |
| 9,099,771 B2 | 8/2015 | Merz et al. |
| 2005/0195051 A1 | 9/2005 | McKinzie |
| 2006/0202784 A1 | 9/2006 | McKinzie |
| 2007/0146102 A1 | 6/2007 | McKinzie |
| 2008/0186111 A1 | 8/2008 | McKinzie |
| 2009/0256758 A1 | 10/2009 | Schlub et al. |
| 2011/0128192 A1 | 6/2011 | Lee et al. |
| 2012/0092221 A1 | 4/2012 | Schlub et al. |
| 2012/0178503 A1 | 7/2012 | Merz et al. |
| 2012/0223865 A1 | 9/2012 | Li et al. |
| 2013/0329173 A1* | 12/2013 | Jung .................. H04B 1/3838 349/122 |
| 2017/0207516 A1* | 7/2017 | Koo ................... H01Q 1/2291 |
| 2017/0250460 A1 | 8/2017 | Shin et al. |

* cited by examiner

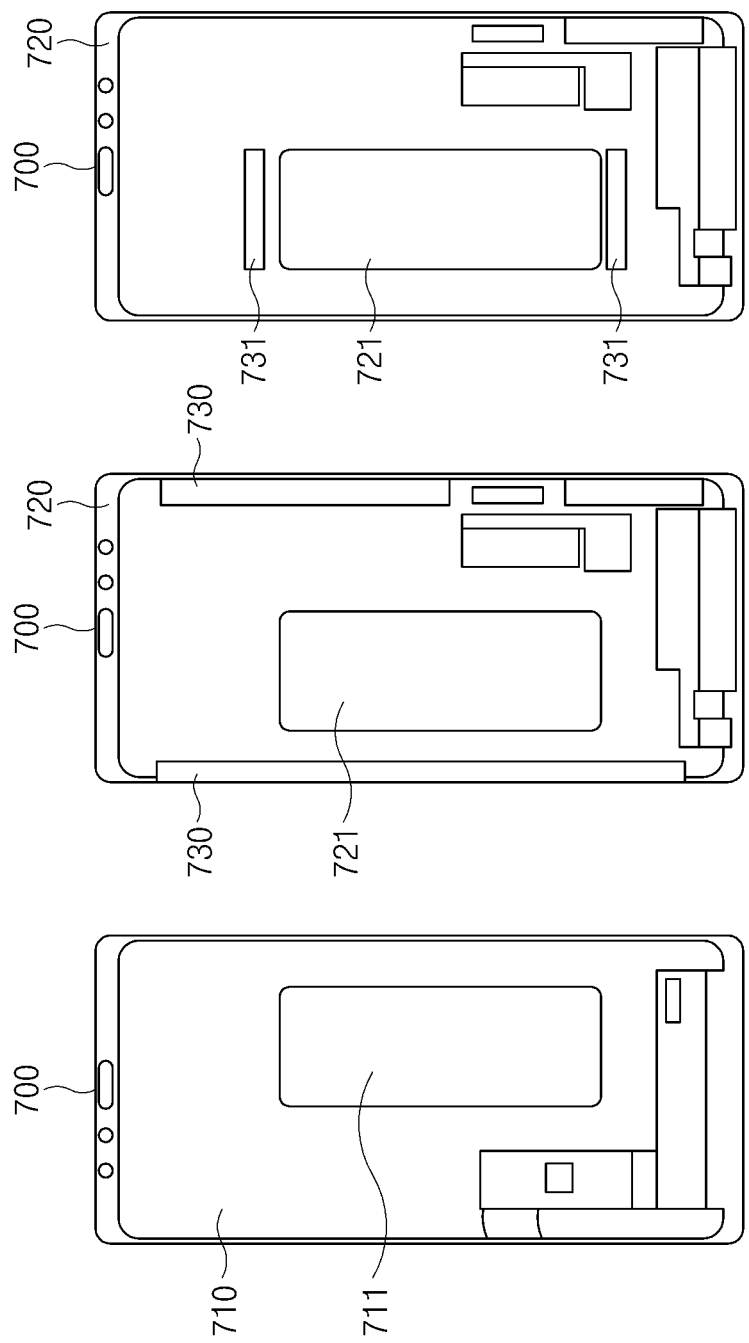

ELECTRONIC DEVICE COMPRISING ANTENNA

CROSS-REFERENCE TO RELATED APPLICATION(S)

This application is based on and claims priority under 35 U.S.C. § 119 to Korean Patent Application Serial No. 10-2017-0114626, filed on Sep. 7, 2017, in the Korean Intellectual Property Office, the entire disclosure of which is incorporated herein by reference.

BACKGROUND

1. Field

The present disclosure relates generally to an electronic device and more particularly, to an electronic device including a technology associated with performance of an antenna.

2. Description of Related Art

An electronic device, which is equipped with a display, such as a smartphone, a wearable device, or the like has been widely supplied as mobile communication technologies develop. The electronic device may execute various functions, such as a photo or video capturing function, a music or video file play function, a game function, an Internet function, and the like, through the display.

Currently, a technology for maximally enlarging the size of the display is being developed with regard to the electronic device. For example, a technology associated with a full front display is being developed.

SUMMARY

An electronic device may include a plurality of components in the electronic device for the purpose of implementing a plurality of functions. Since a user interface (UI) and content which may be displayed vary with the size of the display included in the electronic device, the display may have a significant influence on a user experience (UX). For this reason, the size of the display is being enlarged. As the size of a bezel in the electronic device is scaled down and the size of the display becomes larger, a region in which a portion of the antenna associated with feeding and ground overlaps with the display may increase. Power leakage may occur due to a transmission line generated according to the above condition, and radiation performance of the antenna may be reduced.

Aspects of the present disclosure are to address at least the above-mentioned problems and/or disadvantages and to provide at least the advantages described below.

In accordance with an aspect of the present disclosure, an electronic device is provided. The electronic device includes a housing including a front plate, a rear plate facing away from the front plate, and a side member surrounding a space between the front plate and the rear plate, where at least a portion of the side member is formed of an electrically conductive material, a display positioned in the space between the front plate and the rear plate, the display including a first conductive layer parallel to the front plate, a conductive structure interposed between the display and the rear plate, the conductive structure including a second conductive layer parallel to the first conductive layer and overlapping at least partially with the first conductive layer when viewed from above the front plate, a printed circuit board interposed between the conductive structure and the rear plate, a wireless communication circuit positioned on the printed circuit board and electrically connected with a portion of the side member, and a conductive patch layer interposed between the first conductive layer and the second conductive layer, wherein at least one portion of the conductive patch layer is extended along the portion of the side member in a first direction or in a second direction perpendicular to the first direction.

In accordance with another aspect of the present disclosure, an electronic device is provided. The electronic device includes a housing including a front plate, a rear plate facing away from the front plate, and a side member surrounding a space between the front plate and the rear plate, the housing including at least one antenna element extended along one portion of the side member, a display exposed through the front plate and including a display panel and a shield layer, a wireless communication circuit electrically connected to the antenna element, a support member, at least a portion of which is positioned in the space in parallel with the shield layer, and a conductive patch layer interposed between the shield layer and the support member.

Accordingly, an aspect of the present disclosure is to provide an electronic device for decreasing or preventing power leakage due to a shield layer included in the electronic device.

An aspect of the present disclosure provides an electronic device which may reduce or remove influence of a transmission line constructed by a shield layer and a support member.

An aspect of the present disclosure provides an electronic device which may prevent power leakage due to the transmission line, and thus, radiation performance of the electronic device may be improved.

BRIEF DESCRIPTION OF THE DRAWINGS

The above and other aspects, features and advantages of certain embodiments of the disclosure will be more apparent from the following detailed description taken in conjunction with the accompanying drawings, in which:

FIGS. 7A, 7B, and 7C are diagrams of patterns of conductive patch layers, according to an embodiment;

DETAILED DESCRIPTION

Figure 1:
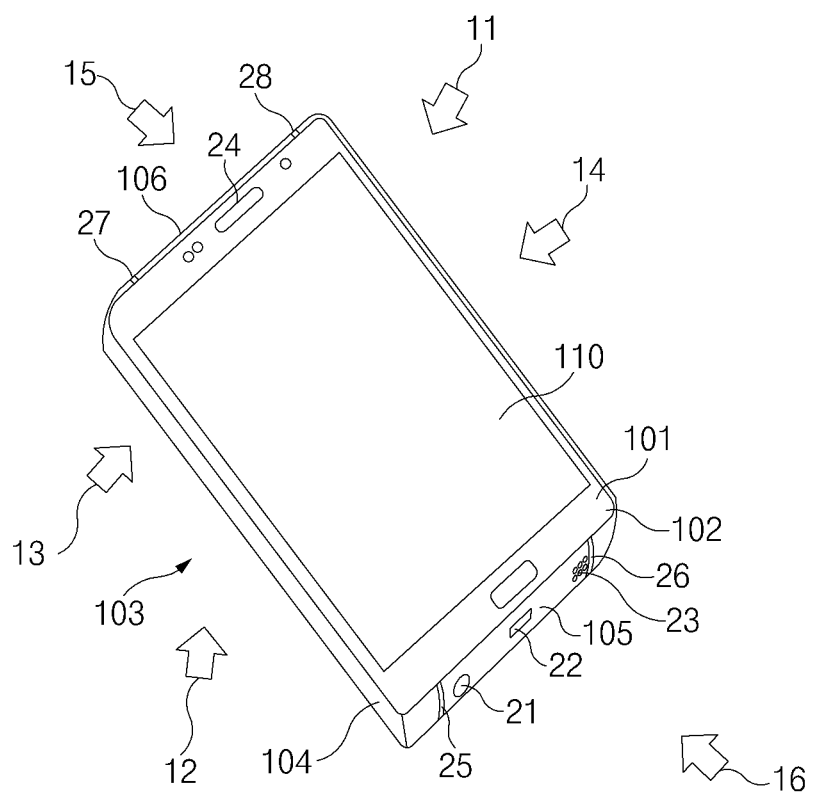
FIG. 1 is a diagram of an electronic device, according to an embodiment.

Embodiments of the disclosure will be described herein below with reference to the accompanying drawings. However, the embodiments of the disclosure are not limited to the specific embodiments and should be construed as including all modifications, changes, equivalent devices and methods, and/or alternative embodiments of the present disclosure. In the description of the drawings, similar reference numerals are used for similar elements.

FIG. 1 is a diagram of an electronic device, according to an embodiment.

An electronic device 100 may include a housing 101 and a display 110. Various circuits or modules such as a processor, a memory, and the like may be positioned within the electronic device 100 (i.e., within the housing 101).

The housing 101 may form at least a portion of the exterior of the electronic device 100. The housing 101 may include a first plate 102 (e.g., a front plate) facing in an upper direction (e.g., a first direction) 11 and a second plate 103 (e.g., a rear plate) facing in a lower direction (e.g., a second direction) 12 which is opposite to the first direction 11. A side member 104 of the housing 101, which surrounds a space between the first plate 102 and the second plate 103, may include a left-side surface facing a left-side direction 13, a right-side surface facing a right-side direction 14, an upper-side surface facing an upper-side direction 15, and a bottom-side surface facing a bottom-side direction 16.

To protect various components in the electronic device 100 from external shock or dust, the housing 101 may be formed of a non-conductive material (e.g., a plastic injection molding material, ceramic, glass, or the like), a conductive material (e.g., metal), or a combination thereof According to an embodiment, the housing 101 may be referred to as an "outer surface of a plurality of components".

The display 110 may be positioned on the first plate 102 of the electronic device 100. The display 110 may be interposed between the first plate 102 facing the first direction 11 and the second plate 103 facing the second direction 12, and may be exposed to the outside through at least a portion of the first plate 102. The display 110 may output a plurality of items (e.g., a text, an image, a video, an icon, a widget, a symbol, and the like).

The electronic device 100 may include a first input/output interface 21 for accommodating a jack (e.g., an ear jack) of an external device. The electronic device 100 may include a second input/output interface 22 (e.g., a universal serial bus (USB) port) for charging the electronic device 100 or for transmitting or receiving data to or from the external device.

The electronic device 100 may include an external speaker hole 23. The electronic device 100 may emit sound through the external speaker hole 23.

The electronic device 100 may include a communication hole 24 formed to allow users to speak to each other. The electronic device 100 may control a speaker, which may emit sound through the communication hole 24, to allow users to speak to each other. The electronic device 100 may flow a voice into air through the communication hole 24. The electronic device 100 may include a microphone hole (not illustrated) formed to allow users to speak to each other. The electronic device 100 may obtain a voice of a user through the microphone hole (not illustrated).

The side member 104 may include at least one conductive region 105 or 106 (hereinafter referred to as an "antenna element") which operates as an antenna. The antenna element 105 or 106 may operate as an antenna which transmits or receives a signal in at least one frequency band. The side member 104 may include non-conductive regions 25, 26, 27, and 28.

The antenna element may include a first antenna element 105 and a second antenna element 106. The first antenna element 105 may be positioned on the bottom side of the electronic device 100, and the second antenna element 106 may be positioned on the upper side of the electronic device 100. The first antenna element 105 and/or the second antenna element 106 may transmit/receive signals of different frequencies, which overlap each other at least partially or do not overlap each other. The first antenna element 105 may operate as a main-antenna used mainly, and the second antenna element 106 may operate as a sub-antenna.

The electronic device 100 may include components which may perform various functions. The electronic device 100 may include a pen hole which may accommodate a touch input pen.

Figure 2:
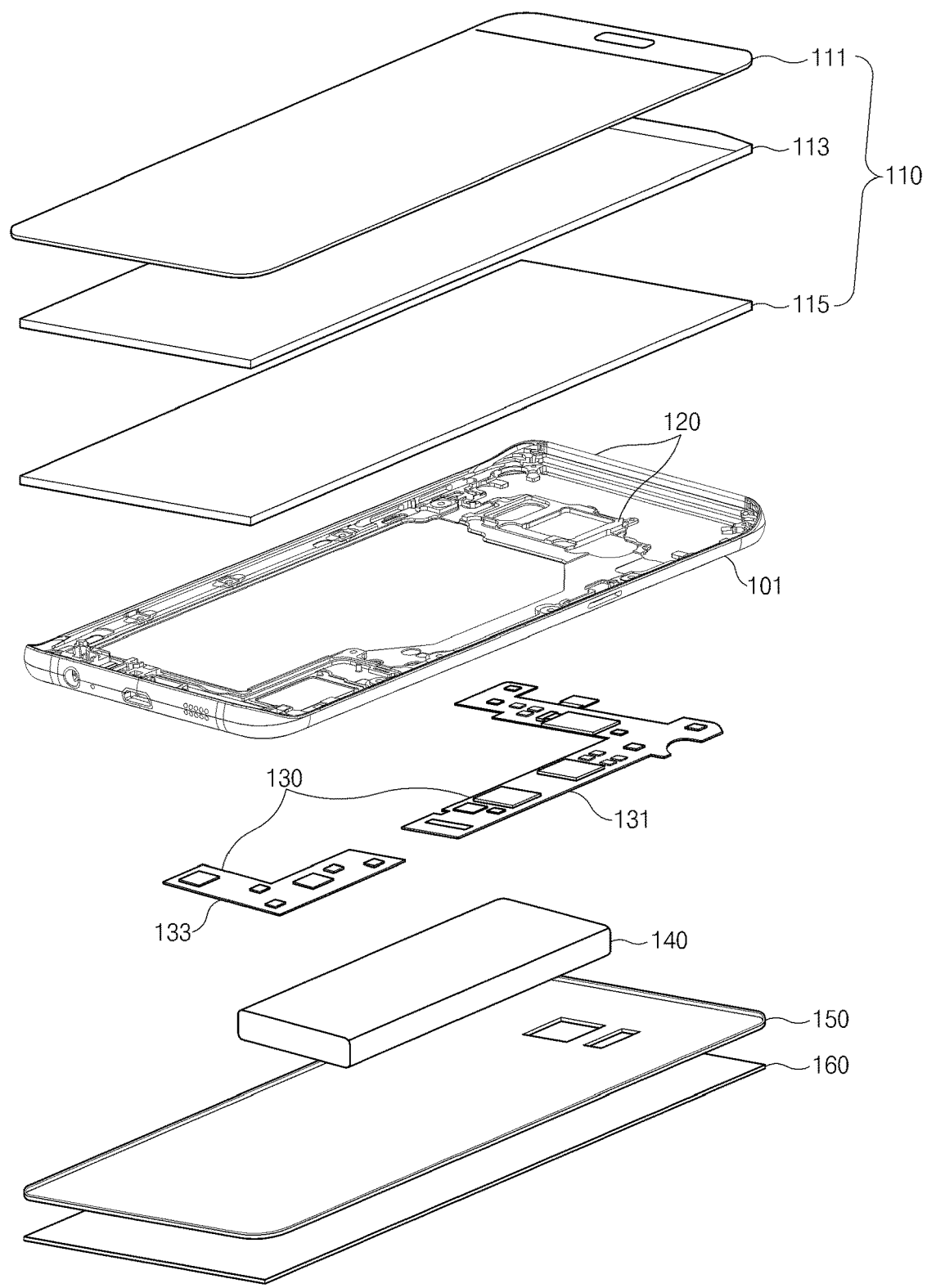
FIG. 2 is a diagram of a configuration of an electronic device, according to an embodiment.

FIG. 2 is a diagram illustrating a configuration of an electronic device, according to an embodiment.

Referring to FIG. 2, the electronic device 100 (e.g., the electronic device 100 of FIG. 1) may include the display 110, a support member 120, the side member 104, a printed circuit board (PCB) 130, a battery 140, a rear 150, and a rear cover 160. The electronic device 100 may not include some of the components illustrated in FIG. 2 or may further include any other component(s) not illustrated in FIG. 2. The order in which the components included in the electronic device 100 are stacked may be different from the stacked order illustrated in FIG. 2.

The display 110 may include a cover glass 111, a display panel 113, and a shield layer 115. According to an embodiment, the display 110 may be exposed through the front plate of the housing 101. The display 110 may further include a touch panel (not illustrated) for receiving a user input. The electronic device 100 may receive the user input (e.g., a touch input) through the touch panel.

The cover glass 111 may transmit light generated by the display panel 113. The user may touch a portion (e.g., a finger) of his/her body on the cover glass 111 to perform touch. The cover glass 111 may be formed of tempered glass, reinforced plastic, a flexible polymer material, or the like.

The display panel 113 may be interposed between the cover glass 111 and the shield layer 115. The display panel 113 may display content. The display panel 113 may include a plurality of pixels for displaying content. The display panel 113 may be electrically connected with the PCB 130. The display panel 113 may be provided with data associated with content (e.g., a text, an image, a video image, an UI, or the like) and may display the content depending on the provided data.

The shield layer 115 may be interposed between the display panel 113 and the support member 120 (or the housing 101). The shield layer 115 may prevent electromagnetic interference between the display panel 113 and the PCB 130. The shield layer 115 may include a thin film sheet or a plate, which is formed of copper (Cu) or graphite. When the shield layer 115 is formed of copper (Cu) or graphite, components included in the electronic device 100 may be grounded to the shield layer 115.

The support member 120 may be interposed between the display 110 and the rear cover 160. The support member 120 may be positioned with the housing 101. The support member 120 may fix internal components of the electronic device 100. The support member 120 may fix the PCB 130. The support member 120 may be positioned parallel to the shield layer 115 and may be spaced from the shield layer 115.

At least a portion of the support member 120 may be formed of a conductive material. The portion of the support member 120 formed of the conductive material may operate as a portion of a radiator for transmitting/receiving a signal. The support member 120 may include a conductive layer which is parallel to the shield layer 115 and overlaps partially with the shield layer 115, when viewed from above the front plate (e.g., the front plate 102 of FIG. 1). The support member 120 may be a conductive structure which is positioned within the housing 101.

The housing 101 may protect the components arranged within the electronic device 100. Components such as the PCB 130, the battery 140, and the like may be accommodated within the housing 101. The housing 101 may protect the accommodated components from external shock.

The housing 101 may include a first surface, a second surface which is opposite to the first surface and is spaced from the first surface, and a side surface surrounding a space between the first surface and the second surface. The support member 120 may be interposed between the first surface and the second surface. The first surface of the housing 101 may correspond to the cover glass 111 of the display 110, and the second surface of the housing 101 may correspond to the rear cover 160 of the electronic device 100. A cover glass (or a rear glass) may be positioned on a rear surface of the housing 101. Alternatively, the housing 101 may include a first plate (e.g., the first plate 102 of FIG. 1), a second plate (e.g., the second plate 103 of FIG. 1), and a side member (e.g., the side member 104 of FIG. 1) surrounding a space between the first plate and the second plate. The first plate may include the first surface, and/or the second plate may include the second surface. The first plate and the second plate may face opposite directions. The side member 104 may include the side surface.

The PCB 130 may include a plurality of components for an operation of the electronic device 100. The plurality of components may be mounted on the PCB 130, and the plurality of components mounted may be electrically connected to each other through a printed circuit. The plurality of components electrically connected may be classified into modules for implementing functions of the electronic device 100. The plurality of components, for example, the PCB 130 may include an application processor (AP), a communication processor (CP), a display driver integrated circuit (DDI), or a communication circuit (or a communication module) (e.g., a communication module 2290 of FIG. 22)The PCB 130 may be referred to as a "main-board" or "printed board assembly (PBA)". The PCB 130 may include a plurality of PCBs. The plurality of PCBs may include, for example, a first PCB (or a main-PCB) 131 and a second PCB (or a sub-PCB) 133. The plurality of PCBs 131 and 133 may be electrically connected to each other.

The PCB 130 may include a communication circuit. The communication circuit may be positioned on the PCB 130. The communication circuit may feed an antenna element to transmit or receive a signal. "Feeding" may refer to the communication circuit applying a current to an antenna element. The PCB 130 may include a ground region (or a ground part). The ground region may be formed in one layer (e.g., a ground layer) of a plurality of layers of the PCB 130. The ground region may be electrically connected with the antenna element to form an electrical path for transmitting or receiving a signal.

The battery 140 may convert chemical energy and electrical energy bidirectionally. The battery 140 may convert chemical energy to electrical energy and may supply the converted electrical energy to the display 110 and a component (or a module) mounted on the PCB 130. The battery 140 may convert and store electrical energy supplied from the outside to chemical energy. The battery 140 may be a secondary cell which may be rechargeable. A charging/discharging state of the battery 140 may be managed by a battery management module (or a battery management system (BMS)) of the PCB 130.

The rear 150 may be coupled on the rear surface of the housing 101. The rear 150 may be formed of plastic.

The rear cover 160 may be coupled on the rear surface of the electronic device 100 (or may be positioned under the rear 150). The rear cover 160 may be integrally formed with the housing 101 and the rear 150. The rear cover 160 may be formed of tempered glass, plastic, or the like.

Figure 3A:
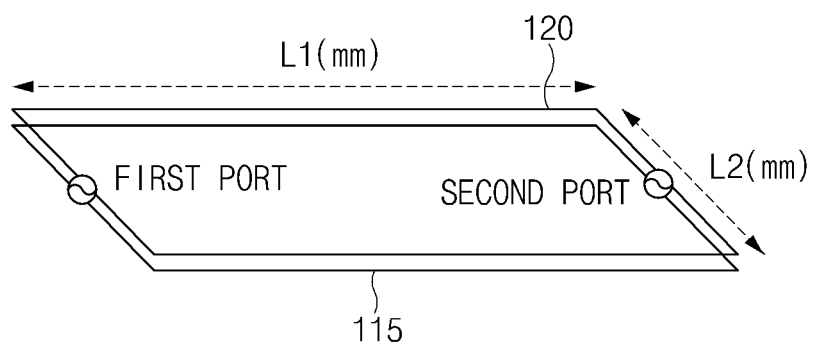
FIGS. 3A and 3B are diagrams of equivalent modeling associated with antenna placement, according to an embodiment.
Figure 3B:
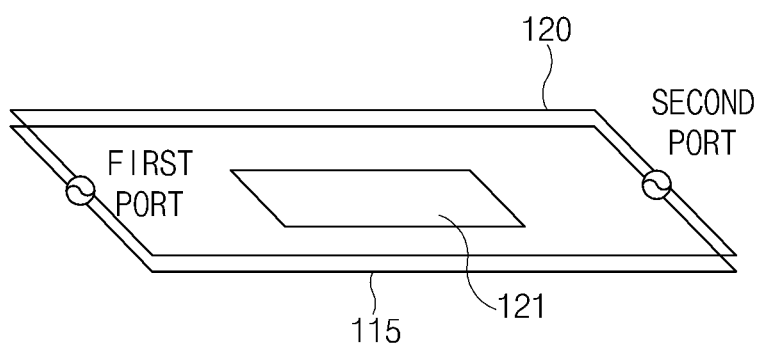

FIGS. 3A and 3B are diagrams of equivalent modeling associated with antenna placement, according to an embodiment.

The support member 120 may be positioned parallel to the shield layer 115 and may be spaced from the shield layer 115. The support member 120 may include a conductive material. A medium such as a dielectric (e.g., a highly-resistant (HR) tape) or a layer of air may be filled between the support member 120 and/or the shield layer 115. The dielectric may be referred to as an "insulating member". A given gap may be formed between the support member 120 and the shield layer 115. A parallel plate waveguide (PPW) transmission line may be formed by the support member 120 (e.g., the support member 120 of FIG. 2) and the shield layer 115 (e.g., the shield layer 115 of FIG. 2).

At least one opening 121 may be defined at the support member 120. The opening 121 may accommodate a portion of a battery (e.g., the battery 140 of FIG. 2), which swells up due to a swelling phenomenon. According to an embodiment, the opening 121 may be filled with air or a medium having permittivity and permeability.

FIG. 3A shows equivalent modeling of an antenna when the support member 120 does not include an opening, and FIG. 3B shows equivalent modeling of an antenna when the support member 120 includes the opening 121.

Referring to FIG. 3A, at the support member 120 and the shield layer 115, there may be formed an equivalent circuit including a first port where a current is induced to the PPW from a feeding part of a main-antenna (e.g., the antenna element 105 of FIG. 1) and a second port for checking a radiation current which is induced from a feeding part of a sub-antenna (e.g., the antenna element 106 of FIG. 1), or a transfer of the radiation current toward an opposite side. The equivalent circuit may be referred to as a "2-port PPW equivalent circuit".

An electronic device may include two or more antennas randomly positioned on the left, right, up, and down sides. The shield layer 115 may be a metal surface of a display (e.g., the display 110 of FIG. 1).

Referring to FIG. 3B, the support member 120 in which the opening 121 is defined, the shield layer 115, a main-antenna, a sub-antenna, and feeding parts may form the 2-port PPW equivalent circuit. In one example, the size of the opening 121 is about 79 mm2 by 26 mm2, but the opening 121 may be defined at various positions with various sizes. The opening 121 may be spaced from an antenna element (e.g., the antenna element 105 of FIG. 1) and may be positioned in a direction facing away from the antenna element.

When the support member 120 and the shield layer 115 are positioned in parallel and a power is supplied to the two or more antennas, a standing wave (or a stationary wave) may occur at a specific frequency by the size of the electronic device 100, and parasitic resonance may be generated. Since a transfer characteristic between two ports is good at the specific frequency, a transmission line may be formed, and a characteristic of a band pass filter may appear. As permittivity of a medium in the PPW increases, a standing wave frequency may be down-shifted. At the standing wave frequency, radiation energy of each antenna cannot be radiated due to the parasitic resonance, thereby resulting in power leakage. This may mean that radiation efficiency of an antenna decreases. Also, an isolation characteristic between antennas may decrease, thereby causing an increase of the coupling.

Figure 4:
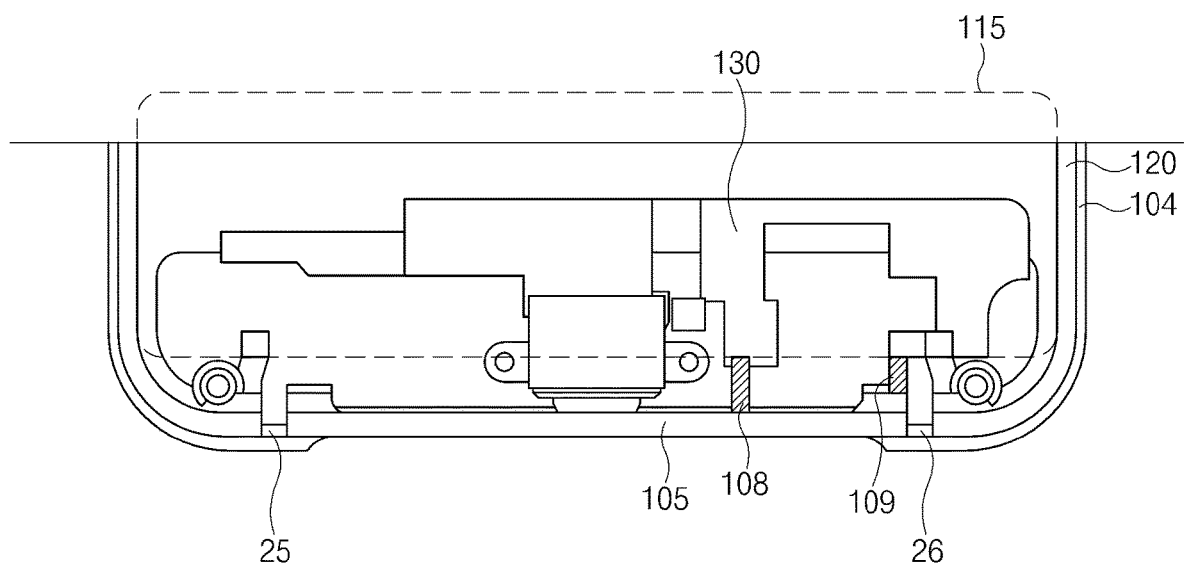
FIG. 4 is a diagram of an antenna feeding structure, according to an embodiment.

FIG. 4 is a diagram of an antenna feeding structure, according to an embodiment.

Referring to FIG. 4, the electronic device 100 (e.g., the electronic device 100 of FIG. 1) may include the shield layer 115 (e.g., the shield layer 115 of FIG. 2), the support member 120 positioned parallel to the shield layer 115, a non-conductive region 25 or 26 formed at the side member 104, or at least one antenna element 105 included in the side member 104.

The antenna element 105 may operate as at least a portion of an antenna. A feeding part 108 may transfer an electrical signal to the antenna element 105. A radiation current induced at the feeding part 108 may be induced to the support member 120 through the PCB 130. The antenna element 105 may be electrically connected to a ground part 109 of the PCB 130.

The feeding part 108 for transferring an electrical signal to the antenna element 105 may be positioned on the PCB 130 (e.g., the PCB 130 of FIG. 2). The feeding part 108 may be positioned on the PCB 130 and may be connected to a communication circuit (e.g., a radio frequency (RF) circuit). The ground part 109 may be connected to the antenna element 105 and the ground region of the PCB 130, and may be connected to the support member 120 through the ground region. A ground part 104 may be positioned adjacent to a non-conductive region (e.g., the non-conductive region 26 of FIG. 1).

Figure 5:
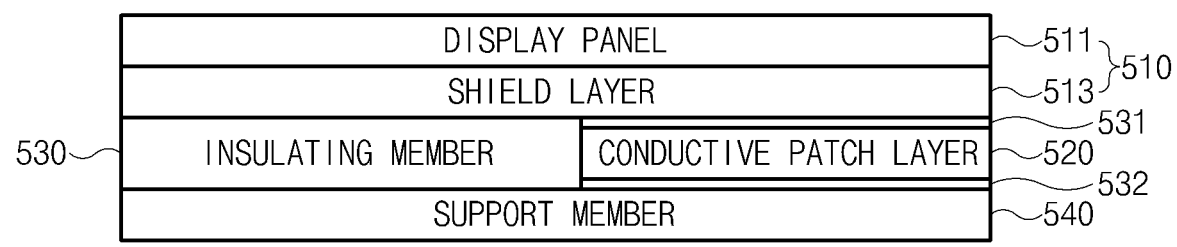
FIG. 5 is a diagram of a stacked structure of an electronic device, according to an embodiment.

FIG. 5 is a diagram of a stacked structure of an electronic device, according to an embodiment.

Referring to FIG. 5, an electronic device 500 (e.g., the electronic device 100 of FIG. 1, 2, or 4) may include a conductive patch layer 520 between a display 510 (e.g., the display 110 of FIG. 1 or 2) and a support member 540 (e.g., the support member 120 of FIG. 2).

The display 510 may include a display panel 511 (e.g., the display panel 113 of FIG. 2) and a shield layer 513 (e.g., the shield layer 115). The shield layer 513 may include a conductive material (e.g., metal).

The conductive patch layer 520 may be interposed between the shield layer 513 of the display 510 or a flexible PCB (FPCB) and the support member 540. The conductive patch layer 520 may be interposed between the shield layer 513 and the support member 540. The conductive patch layer 520 may be a Cu sheet. The conductive patch layer 520 may be attached to the shield layer 513 and/or the support member 540 by using an insulating tape (e.g., an HR tape).

An insulating member 530 may be interposed between the shield layer 513 and the support member 540. The insulating member 530 may be interposed between the shield layer 513 and the support member 540 for the purpose of preventing electric shock due to direct current (DC) connection. The insulating member 530 may be an insulating tape (e.g., an HR tape).

The conductive patch layer 520 and the insulating member 530 may be positioned in parallel (or in a row) between the shield layer 513 and the support member 540 and may form one layer.

The shield layer 513 and the support member 540 may not be connected in DC. The conductive patch layer 520 may include a non-conductive member 531 or 532 for insulating the shield layer 513 and the support member 540, or the non-conductive member 531 or 532 may be positioned on the conductive patch layer 520. The non-conductive member 531 or 532 of a film form may be attached to at least one surface (an upper surface and/or a lower surface) of the conductive patch layer 520. A surface of the conductive patch layer 520, which does not be in contact with the non-conductive member 531 or 532 of the film form, may be in contact with the shield layer 513 or the support member 540, thus being electrically connected to the shield layer 513 or the support member 540. When a surface of the conductive patch layer 520, to which the non-conductive member 531 or 532 of the film form is not attached, is in contact with the shield layer 513 and a surface of the conductive patch layer 520, to which the non-conductive member 531 or 532 of the film form is attached, is in contact with the support member 540, the shield layer 513 and the support member 540 may not be connected to each other in DC.

The non-conductive member 531 or 532 may be formed of an insulating material. The non-conductive member 531 or 532 may be formed integrally with or separately from the insulating member 530.

The conductive patch layer 520 may be electrically isolated from the shield layer 513 and the support member 540. The conductive patch layer 520 may be surrounded with an insulating material or may be isolated from the shield layer 513 and the support member 540 by using an insulating material. The conductive patch layer 520 may be electrically connected to the shield layer 513 and may be isolated from the support member 540. The conductive patch layer 520 may be connected to the support member 540 in DC and may be isolated from the shield layer 513. An insulating tape may be interposed or attached between the conductive patch layer 520 and the shield layer 513 and/or the support member 540.

Thicknesses of insulating tapes attached to the insulating member 530 and the conductive patch layer 520, and/or the conductive patch layer 520 may be identical or similar to each other. The insulating member 530 may be about 0.06 T, and the conductive patch layer 520 and/or the insulating tape may be about 0.06 T. The conductive patch layer 520 may be about 0.04 T, and the insulating tape may be about 0.02 T.

The configuration of FIG. 5 may be changed or modified according to aspects of the present disclosure. The electronic device 500 may not include the insulating member 530.

Figure 6:
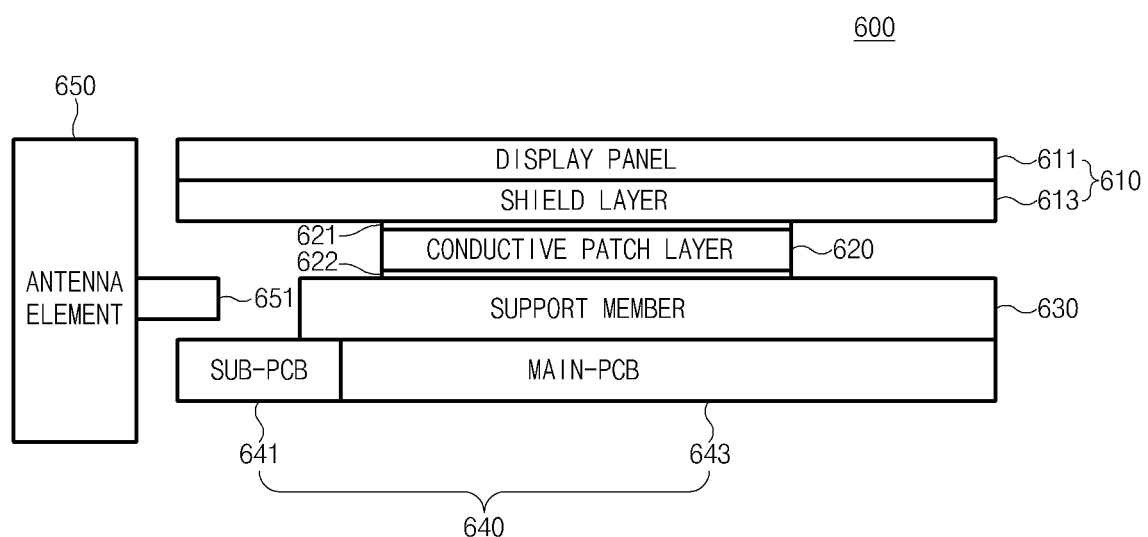
FIG. 6 is a diagram of a stacked structure of an electronic device, according to an embodiment.

FIG. 6 is a diagram of a stacked structure of an electronic device, according to an embodiment.

Referring to FIG. 6, an electronic device 600 (e.g., the electronic device 100 of FIGS. 1 and 2 or the electronic device 500 of FIG. 5) may include a display 610 including a display panel 611 and a shield layer 613, a conductive patch layer 620, a support member 630, a PCB 640 including a sub-PCB 641 and a main-PCB 643, or an antenna element 650. The display 610, the conductive patch layer 620, and the support member 630 are identical or similar to the display 510, the conductive patch layer 520, and the support member 540 of FIG. 5, and thus, additional description will be omitted to avoid redundancy.

The antenna element 650 may be identical or similar to the first antenna element 105 and/or the second antenna element 106 of FIG. 1. The electronic device 600 may transfer an electrical signal to the antenna element 650. When the electrical signal is supplied to the antenna element 650, the antenna element 650 may operate as an antenna. For feeding, the antenna element 650 may be electrically connected to a connection member 651. The connection member 651 may include a flange.

The PCB 640 may be fixed to the support member 630. The PCB 640 may be positioned on and attached to a surface of the support member 630, which faces a direction opposite to the display 610.

The PCB 640 may include the main-PCB 643 and the sub-PCB 641. A feeding part or a communication circuit may be positioned on the PCB 640 for the purpose of supplying an electrical signal to the antenna element 650. The feeding part or the communication circuit may be positioned on the sub-PCB 641.

At least a partial space between the display 610 and the support member 630 may be filled with a medium such as air or a dielectric having permittivity and permeability.

When the conductive patch layer 620 is interposed between the display 610 and the support member 630, power leakage due to parasitic resonance may decrease, and radiation performance of the antenna element 650 may be improved.

The conductive patch layer 620 may be of a pattern for improving the radiation performance. The shield layer 613 and the support member 630 may not be connected in DC. A non-conductive member 621 or 622 may be positioned on the conductive patch layer 620. The conductive patch layer 620 may be electrically isolated from at least one of the shield layer 613 or the support member 630. The non-conductive member 621 or 622 may be attached to at least one surface (an upper surface and/or a lower surface) of the conductive patch layer 620.

The non-conductive member 621 or 622 having a film form may be positioned on the conductive patch layer 620. A surface of the conductive patch layer 620, to which the non-conductive member 621 or 622 of the film form is not attached, may be in contact with the shield layer 613 or the support member 630, thus being electrically connected to the shield layer 613 or the support member 630. The non-conductive member 621 or 622 may be formed of an insulating material.

FIGS. 7A, 7B, and 7C are diagrams of patterns of conductive patch layers, according to an embodiment.

FIG. 7A shows a support member 710 (e.g., the support member 120 of FIG. 2), and FIGS. 7B and 7C show patterns of conductive patch layers 730 and 731 on a shield layer 720 (e.g., the shield layer 115 of FIG. 2). The conductive patch layers 730 and 731 are illustrated in FIGS. 7B and 7C as being attached to the shield layer 720, but the conductive patch layers 730 and 731 may be positioned on the support member 710 or may be interposed between the support member 710 and the shield layer 720. An opening 711 (e.g., the opening 121 of FIG. 3) is defined in the support member 710, but the support member 710 may not include the opening 711.

Referring to FIGS. 7B and 7C, an electronic device 700 (e.g., the electronic device 100 of FIGS. 1 and 2, the electronic device 500 of FIG. 5, or the electronic device 600 of FIG. 6) may include the shield layer 720 in a housing (e.g., the housing 101 of FIG. 1). A region 721 corresponding to the opening 711 of the support member 710 may be referred to as an opening 721.

A conductive patch layer 730 may be positioned at the outermost of the electronic device 700. The conductive patch layer 730 may be positioned vertically or horizontally along the outermost of the electronic device 700. The conductive patch layer 730 may be positioned in the form of a square/rectangle along the outermost of the electronic device 700.

A conductive patch layer 731 may be positioned at the outermost of the opening 721 (or the opening 711). The conductive patch layer 731 may be positioned at an edge of the opening 721 (or the opening 711). The conductive patch layer 731 may be positioned vertically or horizontally along the edge of the opening 721 (or the opening 711). The conductive patch layer 731 may be positioned in the form of a square/rectangle along the outermost edge of the opening 721 (or the opening 711).

FIGS. 8A, 8B, 8C, 8D, and 8E are diagrams of patterns of conductive patch layers, according to an embodiment.

FIGS. 8A to 8E show patterns of conductive patch layers 820 to 824. The conductive patch layers 820 to 824 are illustrated in FIGS. 8A to 8E as being attached to a support member 810, but the conductive patch layers 820 to 824 may be attached to a shield layer (e.g., the shield layer 720 of FIG. 7B or 7C). The support member 810 may include an opening 811, and each of conductive patch layers 820 to 824 may be positioned to cross the opening 811.

Each of the conductive patch layers 820 to 824 may include a first region crossing the opening 811 and a second region formed along an edge of the opening 811. The first region and the second region may be connected to each other.

Figure 8E:
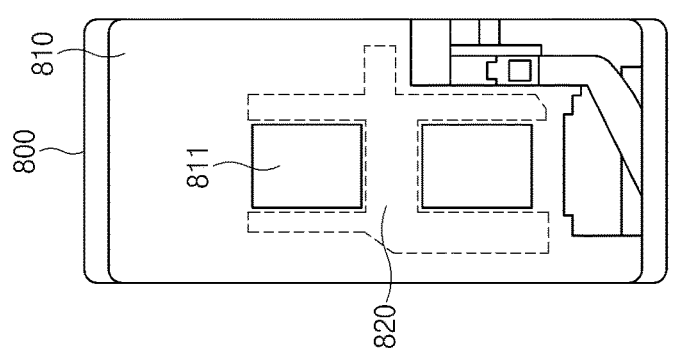
FIGS. 8A, 8B, 8C, 8D, and 8E are diagrams of patterns of conductive patch layers, according to an embodiment.
Figure 8D:
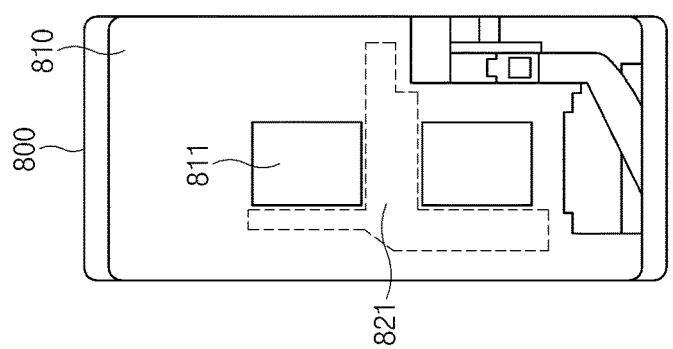
Figure 8C:
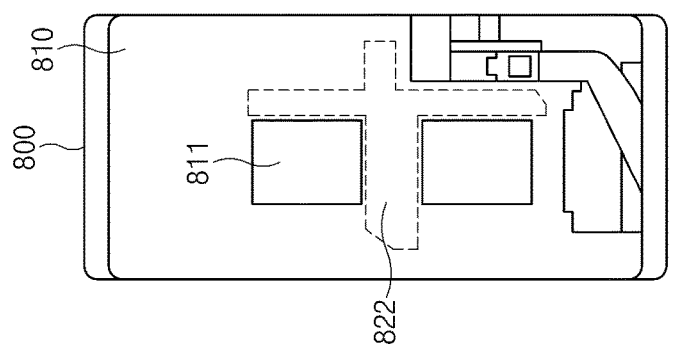
Figure 8B:
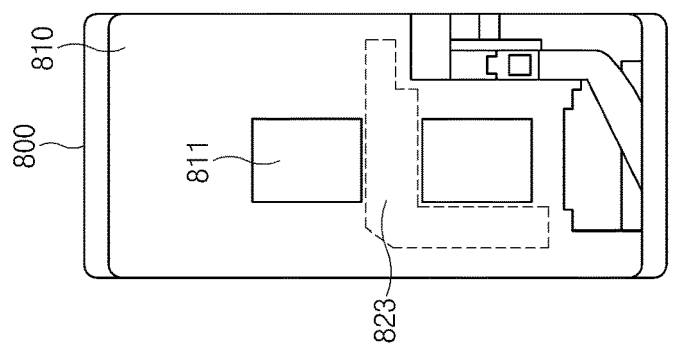
Figure 8A:
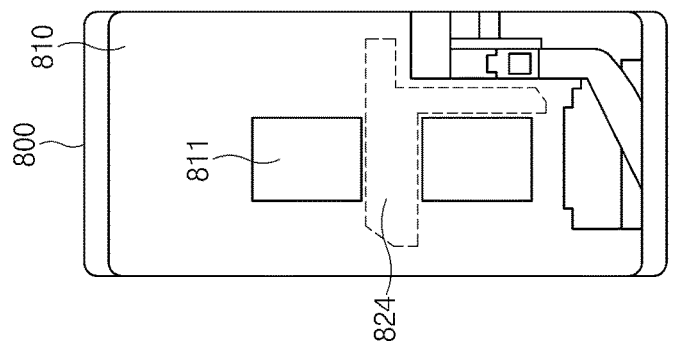

Referring to FIG. 8A, a conductive patch layer 820 may include a first region crossing the opening 811 and a second region formed along opposite edges of the opening 811. A combination of the first region and the second region may correspond to an "H" shape. The first region may be positioned in parallel with an antenna element (e.g., the antenna element 105 of FIG. 1). The second region may be perpendicular to the first region.

Referring to FIGS. 8B and 8C, each of the conductive patch layers 821 and 822 may include a first region crossing the opening 811 and a second region formed along one of opposite edges of the opening 811. The first region may be positioned to cross the second region or to meet one point between opposite ends of the second region. A combination of the first region and the second region may correspond to a "T" shape. The "T" shape may be a laid shape when viewing the electronic device 800 (e.g., the electronic device 100 of FIGS. 1 and 2, the electronic device 500 of FIG. 5, or the electronic device 600 of FIG. 6) in a vertically long direction.

Referring to FIGS. 8D and 8E, the conductive patch layers 823 and 824 may be positioned in the form of a laid "L" shape. Each of the conductive patch layers 823 and 824 may include a first region crossing the opening 811 and a second region formed along one of opposite edges of the opening 811. The first region may be positioned adjacent to one end of the second region. A combination of the first region and the second region may correspond to an "L" shape. The "L" shape may be a laid shape when viewing the electronic device 800 (e.g., the electronic device 100 of FIGS. 1 and 2, the electronic device 500 of FIG. 5, or the electronic device 600 of FIG. 6) in a vertically long direction.

Figure 9:
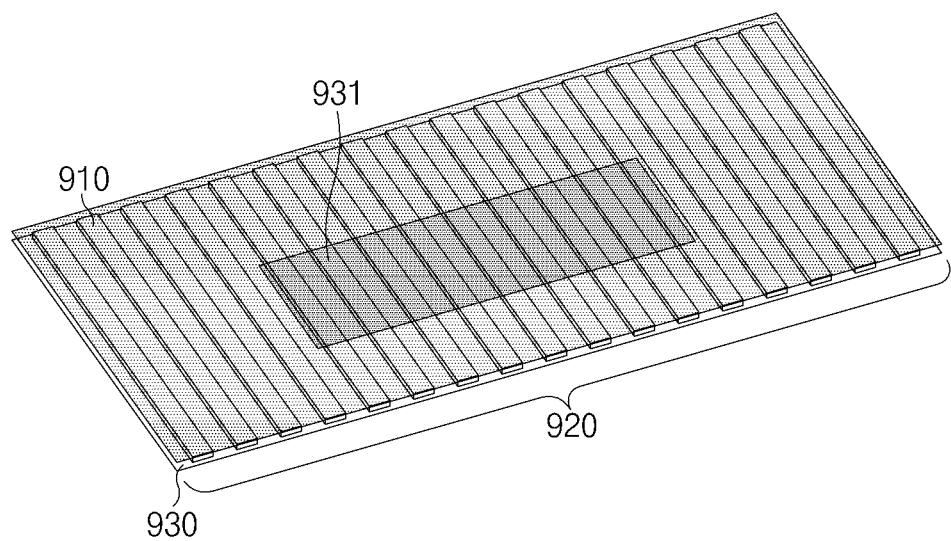
FIG. 9 is a diagram of a pattern of a conductive patch layer, according to an embodiment.

FIG. 9 is a diagram a pattern of a conductive patch layer, according to an embodiment.

A conductive patch layer 920 may include patterns arranged regularly between a shield layer 910 (e.g., the shield layer 115 of FIG. 2, the shield layer 513 of FIG. 5, or the shield layer 613 of FIG. 6) and a support member 930 (e.g., the support member 120 of FIG. 2, the support member 540 of FIG. 5, or the support member 630 of FIG. 6). The conductive patch layer 920 may form a regular pattern having a given interval. Alternatively, a pattern interval of the conductive patch layer 920 may be regular or irregular.

The conductive patch layer 920 may be placed wholly within a PPW transmission line formed by the support member 930 and the shield layer 910. The conductive patch layer 920 may be placed only at one portion of the inside of the PPW transmission line locally anywhere.

The conductive patch layer 920 may be connected to the support member 930 in DC or may be connected to the shield layer 910 in DC. The conductive patch layer 920 may not be connected to both the support member 930 and the shield layer 910 in DC.

A layer of air or a medium having permittivity and permeability may be interposed between the patterns of the conductive patch layer 920. The medium between the patterns may be implemented with a material having adhesion.

The support member 930 may include an opening 931. According to an embodiment, at least a part of the patterns of the conductive patch layer 920 may cross the opening 931. The conductive patch layer 920 may be positioned in a direction crossing the opening 931.

According to an embodiment, an electronic device (e.g., the electronic device 100 of FIGS. 1 and 2, the electronic device of FIG. 5, the electronic device 600 of FIG. 6, the electronic device 700 of FIG. 7, or the electronic device 800 of FIG. 8) may include a housing (e.g., the housing 101 of FIG. 1) that includes a front plate (e.g., the first plate 102 of FIG. 1), a rear plate (e.g., the second plate 103 of FIG. 1) facing away from the front plate, and a side member (e.g., the side member 104 of FIG. 1) surrounding a space between the front plate and the rear plate. At least a portion of the side member may be formed of an electrically conductive material.

The electronic device may include a display (e.g., the display 110 of FIG. 2) that is positioned in the space between the front plate and the rear plate and includes a first conductive layer (e.g., the shield layer 115 of FIG. 2) parallel to the front plate.

The electronic device may include a conductive structure (e.g., the support member 120 of FIG. 2) that is interposed between the display and the rear plate and includes a second conductive layer parallel to the first conductive layer and overlapping at least partially with the first conductive layer when viewed from above the front plate.

The electronic device may include a printed circuit board (e.g., the PCB 130 of FIG. 1) that is interposed between the conductive structure and the rear plate.

The electronic device may include a wireless communication circuit (e.g., the communication module 2290 of FIG. 22) that is positioned on the printed circuit board and electrically connected with a portion of the side member, and a conductive patch layer (e.g., the conductive patch layer 520 of FIG. 5) that is interposed between the first conductive layer and the second conductive layer, at least one portion of the conductive patch layer being extended along the portion of the side member in a first direction or in a second direction perpendicular to the first direction.

The patch layer may be attached to the second conductive layer. The patch layer may be electrically isolated from at least one of the first conductive layer or the second conductive layer. The patch layer may be formed of copper.

The second conductive layer may include an opening (e.g., the opening 121 of FIG. 3), the electronic device may further include a battery (e.g., the battery 140 of FIG. 2) partially positioned in the opening.

The patch layer may be extended in the first direction across the opening. The patch layer may include a first portion extended in the first direction, and a second portion extended from one end of the first portion in the second direction.

The patch layer may further include a third portion extended from another end of the first portion in the second direction.

The patch layer may be extended along an edge of the second conductive layer.

The patch layer may include patterns arranged regularly.

The electronic device may further include an insulating member (e.g., the insulating member 530 of FIG. 5) that is interposed between the first conductive layer and the second conductive layer, and the insulating member may not overlap with the patch layer when viewed from above the front plate.

The insulating member may have permittivity or permeability. The insulating member may include an HR tape.

The first conductive layer may be formed of copper.

The side member may include two or more regions (e.g., the antenna elements 105 and 106 of FIG. 1) that are physically spaced from each other and are formed of an electrically conductive material.

The wireless communication circuit may be electrically connected to the two or more regions formed of an electrically conductive material.

According to an embodiment, an electronic device (e.g., the electronic device 100 of FIGS. 1 and 2, the electronic device of FIG. 5, the electronic device 600 of FIG. 6, the electronic device 700 of FIG. 7, or the electronic device 800 of FIG. 8) may include a housing (e.g., the housing 101 of FIG. 1) that includes a front plate (e.g., the first plate 102 of FIG. 1), a rear plate (e.g., the second plate 103 of FIG. 1) facing away from the front plate, and a side member (e.g., the side member 104 of FIG. 1) surrounding a space between the front plate and the rear plate and includes at least one antenna element (e.g., the antenna element 105 or 106 of FIG. 1) extended along one portion of the side member.

The electronic device may include a display (e.g., the display 110 of FIG. 1) that is exposed through the front plate and includes a display panel (e.g., the display panel 113 of FIG. 2) and a shield layer (e.g., the shield layer 115 of FIG. 2).

The electronic device may include a wireless communication circuit (e.g., the communication module 2290 of FIG. 22) that is electrically connected to the antenna element.

The electronic device may include a support member (e.g., the support member 120 of FIG. 2), at least a portion of which is positioned in the space in parallel with the shield layer.

The electronic device may include a conductive patch layer (e.g., the conductive patch layer 520 of FIG. 5) that is interposed between the shield layer and the support member.

The conductive patch layer may be electrically connected to the shield layer or the support member. The conductive patch layer may be electrically isolated from at least one of the support member and the shield layer.

The support member may include an opening (e.g., the opening 121 of FIG. 3) that is formed to be spaced from the antenna element. The electronic device may further include a battery (e.g., the battery 140 of FIG. 1), and the opening may be formed to correspond to a size of the battery.

Figure 10:
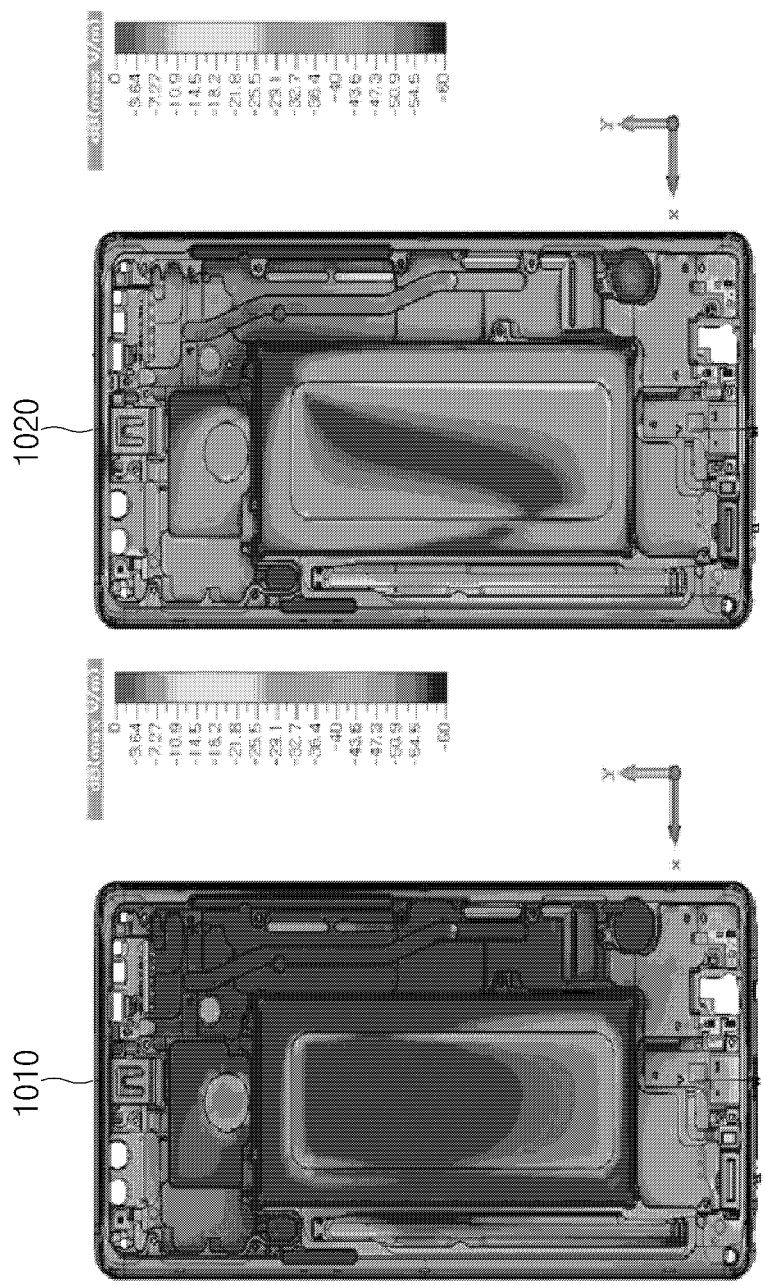
FIG. 10 is a diagram of electric field distribution of an electronic device, according to an embodiment.

FIG. 10 is a diagram of electric field distribution of an electronic device, according to an embodiment.

Each of a first distribution 1010 and a second distribution 1020 indicates electric field distribution at a support member (e.g., the support member 120 of FIG. 2) and a shield layer (e.g., the shield layer 115 of FIG. 2) when a power is supplied to an antenna (e.g., the antenna element 105 of FIG. 1) of a lower end of an electronic device (e.g., the electronic device 100 of FIG. 1).

The first distribution 1010 indicates the electric field distribution upon feeding an antenna when the PPW is not formed, and the second distribution 1020 indicates the electric field distribution upon feeding the lower-end antenna at a standing wave frequency of the PPW.

Referring to the first distribution 1010, in the case where the PPW is not formed, an electric field may be distributed mostly at the lower-end antenna, thus making parasitic resonance low and radiation performance high.

Referring to the second distribution 1020, at the standing wave frequency of the PPW, a large part of an electric field applied to the lower-end antenna may be leaked to an opening (e.g., a battery hole) and/or an upper-end sub-antenna through the PPW transmission line. That is, a power may be leaked. Also, a pen hole may be formed when an electronic device equipped with a pen. Parasitic resonance may also be generated through the pen hole due to a radiation current leaked through the PPW transmission line.

Referring to the first distribution 1010 and the second distribution 1020, radiation performance of an antenna may decrease due to parasitic resonance when a standing wave of the PPW occurs.

Figure 11:
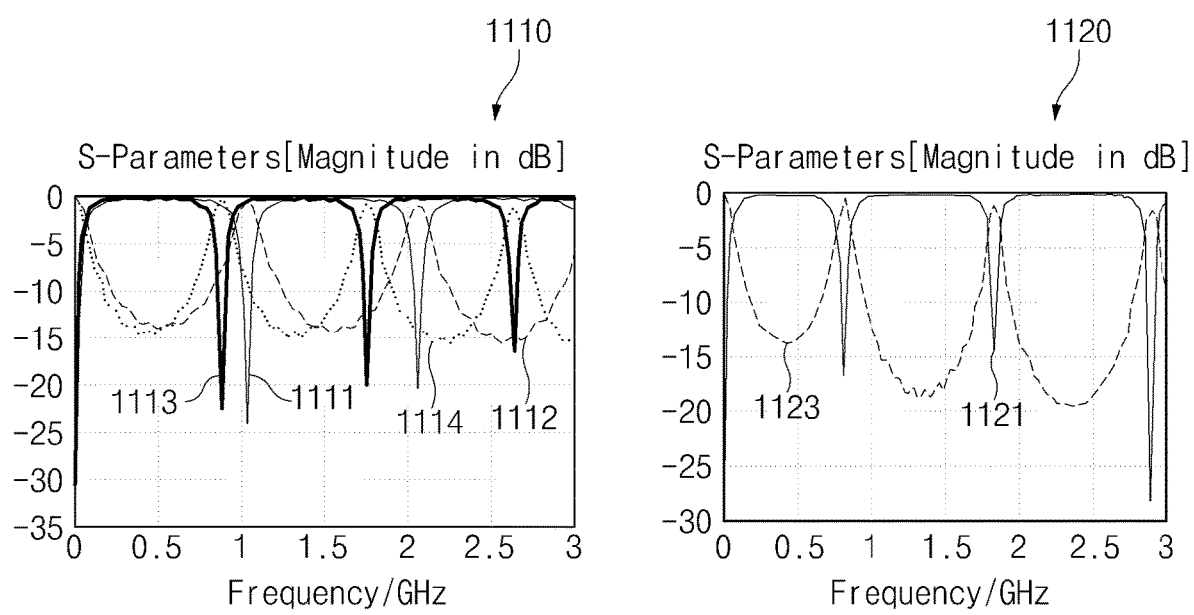
FIG. 11 is a diagram of antenna efficiency, according to an embodiment.

FIG. 11 is a diagram of antenna efficiency, according to an embodiment.

A first result 1110 of FIG. 11 indicates a reflection characteristic S11 or S22 and a transfer characteristic S12 or S21 of a 2-port PPW transmission line when a support member (e.g., the support member 120 of FIG. 3) does not include an opening (e.g., FIG. 3A), and a second result 1120 indicates the reflection characteristic and the transfer characteristic of the 2-port PPW transmission line when a support member includes an opening (e.g., FIG. 3B).

In the first result 1110, a first line 1111 indicates the reflection characteristic of the PPW transmission line when the size ((L1, L2) of FIG. 3A) of an electronic device (e.g., the electronic device 100 of FIG. 1) is (145, 67) mm2 (hereinafter, the unit will be omitted), and a second line 1112 indicates the transfer characteristic of the PPW transmission line at the electronic device having the above size.

Referring to the first line 1111 and the second line 1112, when the size of the electronic device is (145, 67), the PPW transmission line has a reflection characteristic of approximately −25 dB at 1030 MHz and has a reflection characteristic of approximately −20 dB at 2060 MHz.

In the first result 1110, a third line 1113 indicates the reflection characteristic of the PPW transmission line when (L1, L2) is (156, 72), and a fourth line 1114 indicates the transfer characteristic of the PPW transmission line at the electronic device having the above size.

Referring to the third line 1113, in the electronic device in which (L1, L2) is (156, 72), the PPW transmission line has the reflection characteristic of approximately −23 dB at 875 MHz and has a reflection characteristic of approximately −20 dB at 1750 MHz.

Referring to the first line 1111 and the third line 1113, a standing wave may occur at a specific frequency by the size of the electronic device, and the transmission line may be constructed because the transfer characteristic between two ports is good at the specific frequency. A characteristic of a band pass filter may appear. Referring to the first line 1111, when (L1, L2) is (145, 67), an antenna shows a band pass characteristic at 1030 MHz and 2060 MHz; in the case where (L1, L2) is (156, 72), an antenna shows a band pass characteristic at 875 MHz and 1750 MHz.

The second result 1120 indicates the transfer characteristic of the PPW transmission line when (L1, L2) is (156, 72). Referring to a first line 1121 of the second result 1120, the transfer characteristic of the PPW transmission line constructed by a shield layer and a support member including an opening is observed to be −17 dB at approximately 0.8 GHz, −14 dB at approximately 1.8 GHz, and approximately −28 dB at a 2.8 GHz band. An antenna may indicate a band pass characteristic at approximately 0.8 GHz, 1.8 GHz, and 2.8 GHz bands.

Referring to the first result 1110 and the second result 1120, when (L1, L2) is (156, 72), when an opening exists, existing 875 MHz standing wave resonance moves to a low frequency and the PPW transfer characteristic may appear before and after 800 MHz, compared with the case where an opening does not exist. Also, compared with the case where an opening does not exist, when an opening exists, an existing 1750 MHz standing wave resonant frequency moves to a high frequency and the PPW transfer characteristic may appear before and after 1800 MHz.

According to the transfer characteristic obtained at the standing wave frequency, radiation energy of each antenna cannot be radiated, thus causing power leakage. This may indicate that radiation efficiency of the antenna decreases. Also, an isolation characteristic between antennas may decrease, thus causing an increase of the coupling.

Figure 12:
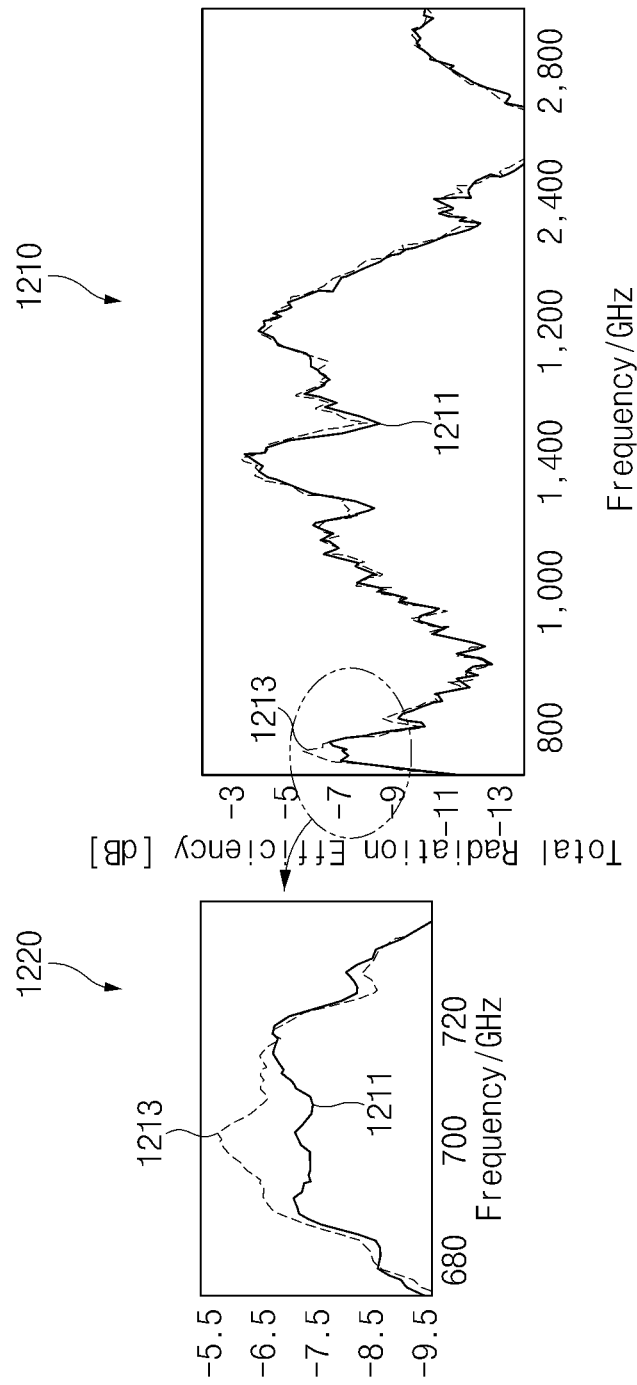
FIG. 12 is a diagram of radiation efficiency of an antenna, according to an embodiment.

FIG. 12 is a diagram of radiation efficiency of an antenna, according to an embodiment.

In FIG. 12, a first result 1210 indicates radiation efficiency of an antenna (a main-antenna) according to whether to place a conductive patch layer of FIG. 7B, and a second result 1210 corresponds to an enlarged view of a partial zone of the first result 1210.

A first line 1211 indicates the radiation efficiency of the antenna when a conductive patch layer is not attached, and a second line 1213 indicates the radiation efficiency of the antenna when a conductive patch layer (e.g., the conductive patch layer 730 of FIG. 7) is placed at the outermost of an opening (e.g., the opening 721 of FIG. 7) of a shield layer (e.g., the shield layer 720 of FIG. 7) in the form of a vertical pattern.

Referring to the first line 1211 and the second line 1213, when the conductive patch layer is placed in the form of the vertical pattern, a PPW transmission frequency may move, and thus, antenna efficiency may be improved in a band (B12 band) ranging from 700 MHz to 740 MHz.

Figure 13:
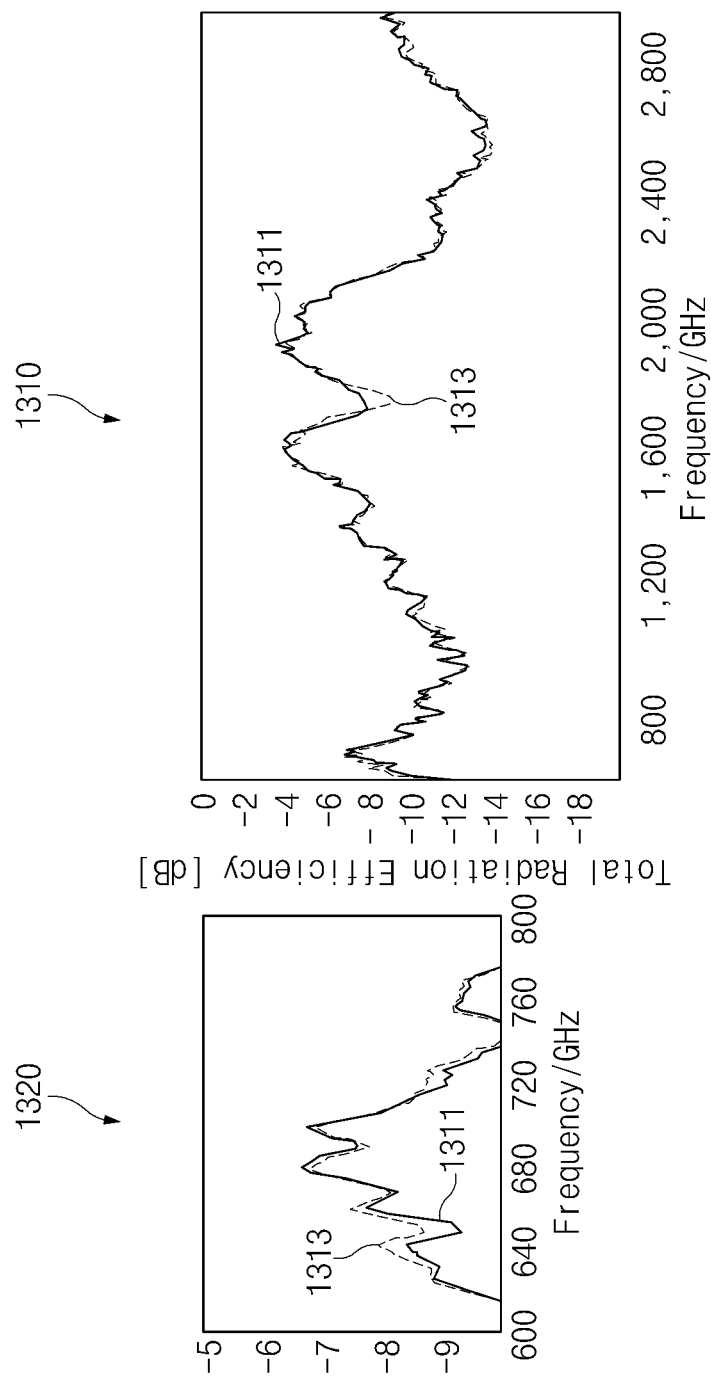
FIG. 13 is a diagram of radiation efficiency of an antenna, according to an embodiment.

FIG. 13 is a diagram of radiation efficiency of an antenna, according to an embodiment.

In FIG. 13, a first result 1310 indicates radiation efficiency of an antenna (a main-antenna) according to whether to place a conductive patch layer of FIG. 7C, and a second result 1320 corresponds to an enlarged view of a partial zone of the first result 1310.

A first line 1311 indicates radiation efficiency of the antenna when a conductive patch layer is not attached, and a second line 1313 indicates radiation efficiency of the antenna when a conductive patch layer (e.g., a conductive patch layer 731 of FIG. 7C) is placed at the outermost of an opening (e.g., the opening 721 of FIG. 7C) of a shield layer (e.g., the shield layer 720 of FIG. 7C) in the form of a horizontal pattern.

Referring to the first line 1311 and the second line 1313, when the conductive patch layer is placed in the form of the horizontal pattern, the PPW transmission frequency may move, and thus, antenna efficiency may be improved in a band (B71 band) ranging from 620 MHz to 640 MHz.

Figure 14:
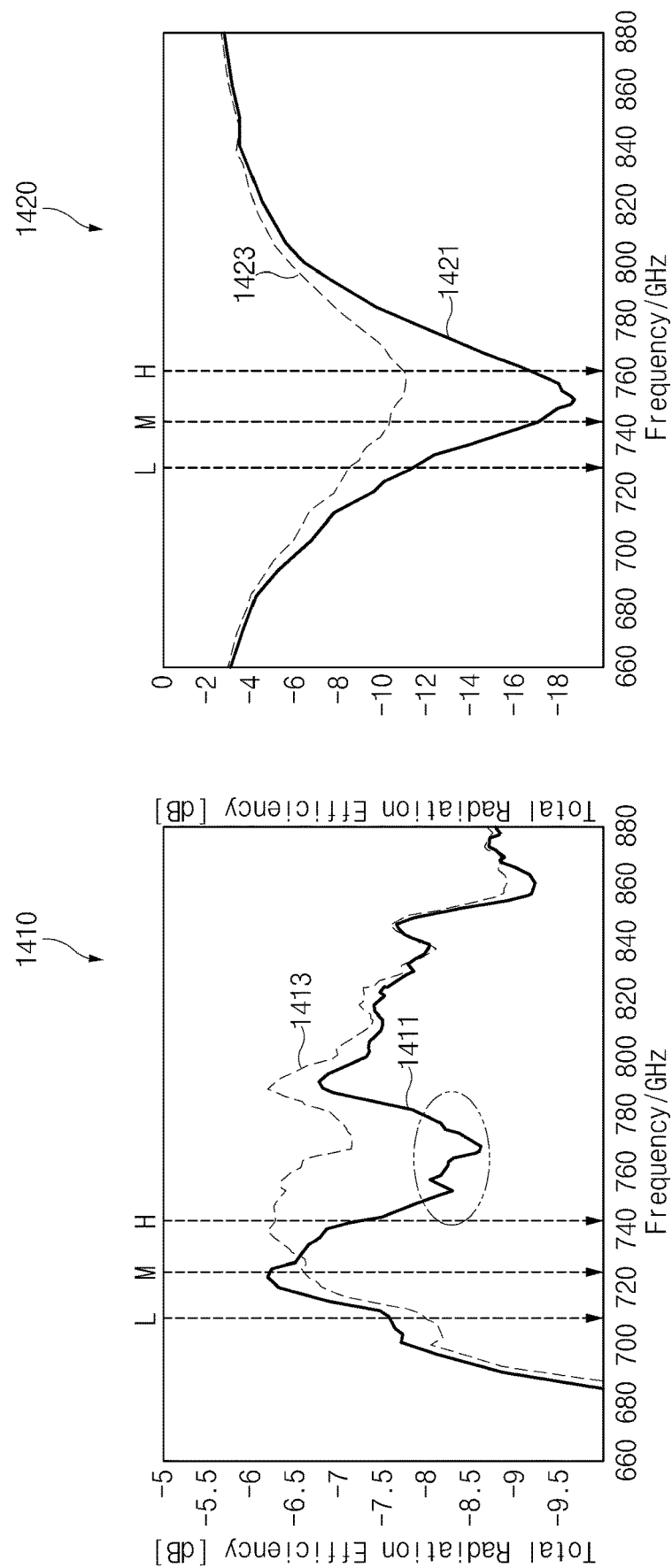
FIG. 14 is a diagram of radiation efficiency and a reflection coefficient of an antenna, according to an embodiment.

FIG. 14 is a diagram of radiation efficiency and a reflection coefficient of an antenna, according to an embodiment.

In FIG. 14, a first result 1410 indicates radiation efficiency of an antenna (a main-antenna) according to whether to place a conductive patch layer of FIG. 7C, and a second result 1210 indicates a reflection coefficient according to whether to place the conductive patch layer. In FIG. 14, the size (L1, L2) of an electronic device may be (145, 67).

In the first result 1410, a first line 1411 indicates the radiation efficiency of the antenna when the conductive patch layer is not placed, and a second line 1413 indicates the radiation efficiency of the antenna when the conductive patch layer is placed.

Referring to the first line 1411, the antenna may have radiation efficiency of −6.6 dB in a 720 MHz frequency band, but the radiation efficiency of the antenna may sharply decrease to approximately −8.5 dB in a frequency band (B28 band) ranging from 750 MHz to 780 MHz due to construction of the PPW transmission line and parasitic resonance. It may be understood from the second line 1413 that the radiation performance of the antennas is improved by placing the conductive patch layer.

In a second result 1420, a third line 1421 indicates the reflection coefficient of the antenna when the conductive patch layer is not placed, and a fourth line 1423 indicates the reflection coefficient of the antenna when the conductive patch layer is placed.

Referring to the third line 1421, the reflection coefficient of the antenna may be approximately −19 dB in the frequency band ranging from 750 MHz to 780 MHz due to construction of the PPW transmission line and parasitic resonance. This indicates that the radiation efficiency is sharply decreased. It may be understood from the fourth line 1423 that the reflection coefficient of the antennas increases to approximately −10 dB in the frequency band ranging from 750 MHz to 780 MHz by placing the conductive patch layer.

Figure 15:
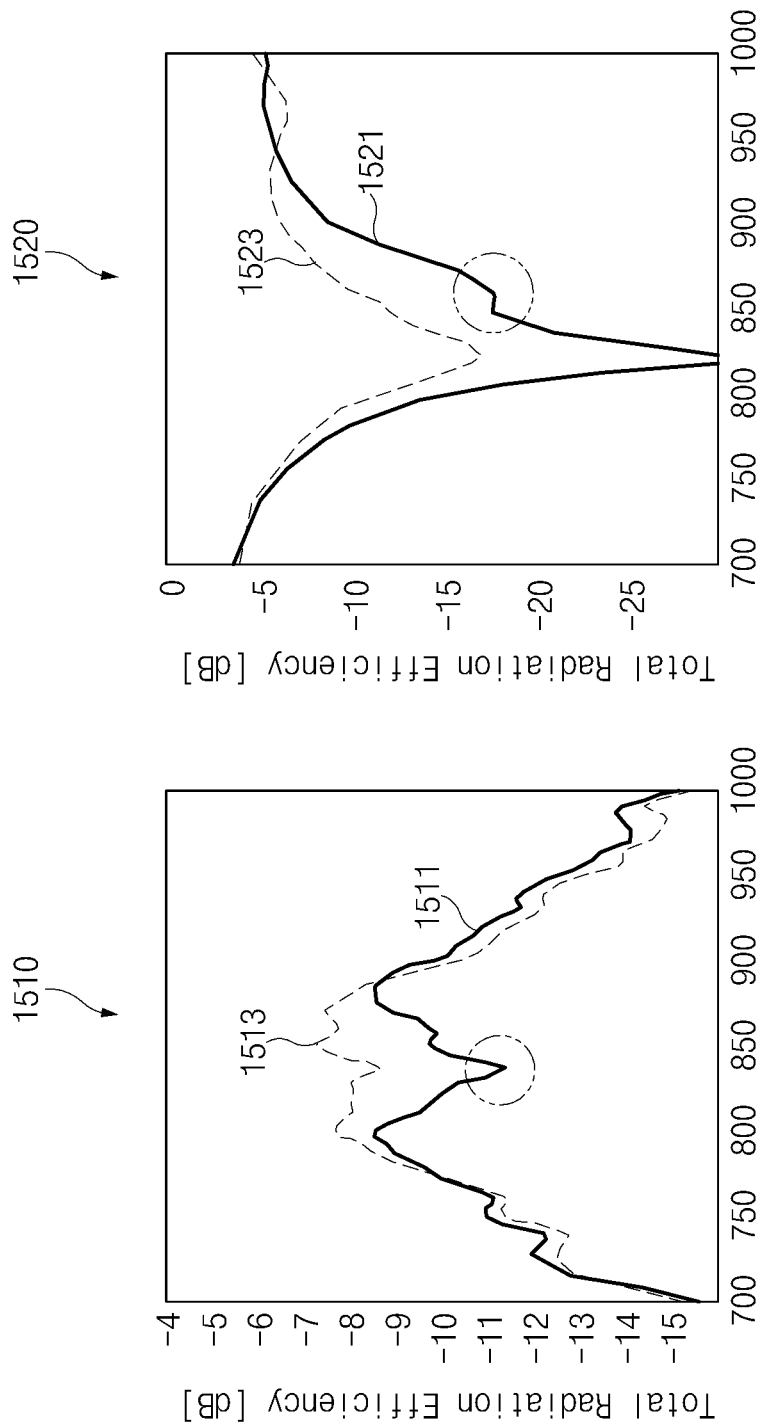
FIG. 15 is a diagram of radiation efficiency and a reflection coefficient of an antenna, according to an embodiment.

FIG. 15 is a diagram of radiation efficiency and a reflection coefficient of an antenna, according to an embodiment.

In FIG. 15, a first result 1510 indicates radiation efficiency of an antenna (a main-antenna) according to whether to place a conductive patch layer, and a second result 1520 indicates a reflection coefficient according to whether to place the conductive patch layer.

In the first result 1510, a first line 1511 indicates the radiation efficiency of the antenna when the conductive patch layer of FIG. 8A is not placed, and a second line 1513 indicates the radiation efficiency of the antenna when the conductive patch layer is placed.

Referring to the first line 1511, the radiation efficiency of the antenna sharply decreases in the 740 MHz frequency band (B20 band). As understood from the second line 1513, performance of the antenna may be improved in the 740 MHz frequency band.

In the second result 1520, a third line 1521 indicates the reflection coefficient of the antenna when the conductive patch layer is not placed, and a fourth line 1523 indicates the reflection coefficient of the antenna when the conductive patch layer is placed.

Referring to the third line 1521, the reflection coefficient of the antenna may be approximately −30 dB in the 740 MHz frequency band. This indicates that the radiation efficiency of the antenna becomes worse. When the conductive patch layer is placed, as understood from the fourth line 1523, the reflection coefficient may increase to approximately −15 dB in the 740 MHz frequency band, and radiation performance of the antennas may be improved.

Figure 16:
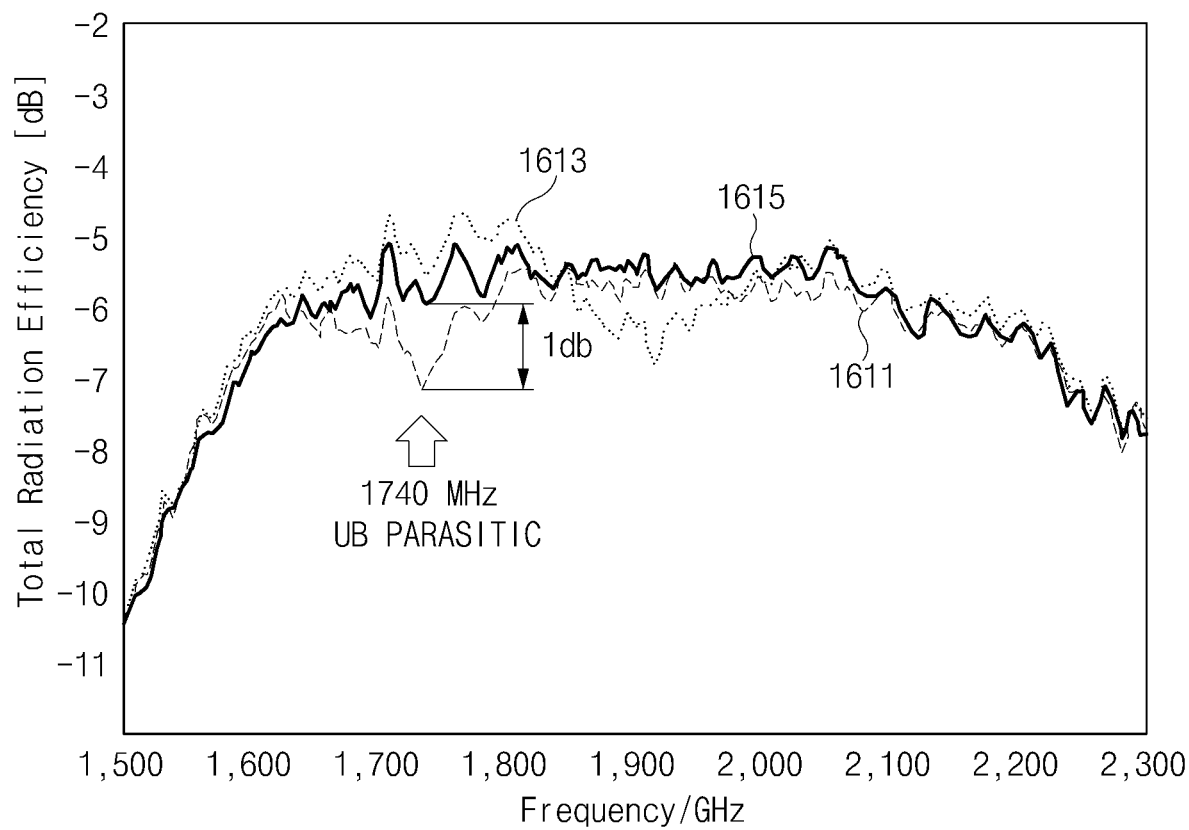
FIG. 16 is a diagram of radiation efficiency of an antenna, according to an embodiment.

FIG. 16 is a diagram radiation efficiency of an antenna according to an embodiment.

FIG. 16 shows radiation efficiency of an antenna according to conductive patch layers illustrated in FIGS. 8A to 8E. A first line 1611 indicates radiation efficiency of an antenna when a conductive patch layer is not placed, a second line 1613 indicates the radiation efficiency of the antenna when the H-shaped conductive patch layer of FIG. 8A (e.g., the conductive patch layer 820 of FIG. 8A)is placed, and a third line 1615 indicates the radiation efficiency of the antenna when the conductive patch layer of T-shaped (or "laid T-shaped") pattern of FIG. 8C (e.g., the conductive patch layer 822 of FIG. 8C) is placed.

Referring to the first line 1611, when the conductive patch layer is not placed, the radiation efficiency of the antenna decreases to approximately −7.2 dB in a 1740 MHz band due to parasitic resonance. Referring to the second line 1613 and the third line 1615, when the conductive patch layer of the T-shaped pattern or the H-shaped pattern is attached to a support member (e.g., the support member 810 illustrated in any one of FIGS. 8A to 8E), the radiation efficiency of the antenna may be improved in the 1740 MHz band as much as 1 dB.

Figure 17:
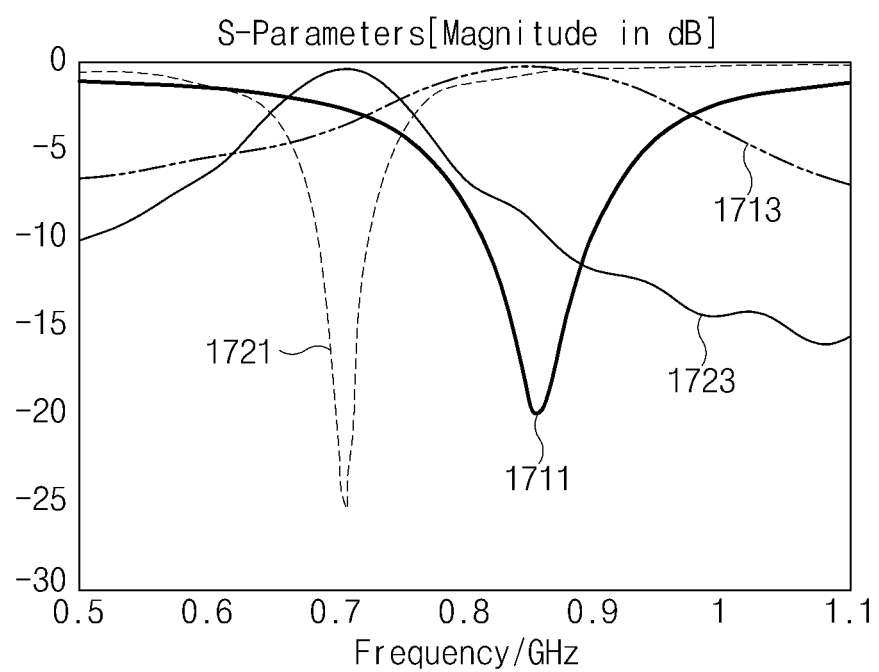
FIG. 17 is a diagram of performance of an antenna, according to an embodiment.

FIG. 17 is a diagram of performance of an antenna, according to an embodiment.

FIG. 17 shows a transfer characteristic and a reflection characteristic of an antenna in a low band when a PPW metal pattern is used and in the case where a conductive patch layer (e.g., the conductive patch layer 920 of FIG. 9) of a regular pattern is placed.

Referring to FIG. 17, when the regular pattern is used, a PPW characteristic frequency in the low band (e.g., a 700 MHz band (B20) or an 850 MHz band (B8)) may decrease and may be out of the band.

A first line 1711 and a second line 1713 indicate the transfer characteristic and the reflection characteristic of the antennas when using the PPW metal pattern, and a third line 1721 and a fourth line 1723 indicate the transfer characteristic and the reflection characteristic of the antennas when using the regular pattern.

It may be understood from the first line 1711 and the third line 1721 that a standing wave oscillates in an 850 MHz band when using the PPW metal pattern and oscillates in a 720 MHz band when using the regular pattern. As such, a frequency band of the standing wave may be down-shifted upon using the regular pattern, and a band cutoff characteristic may be secured in a band such as B20 or B8 by using a PPW filter structure.

Figure 18:
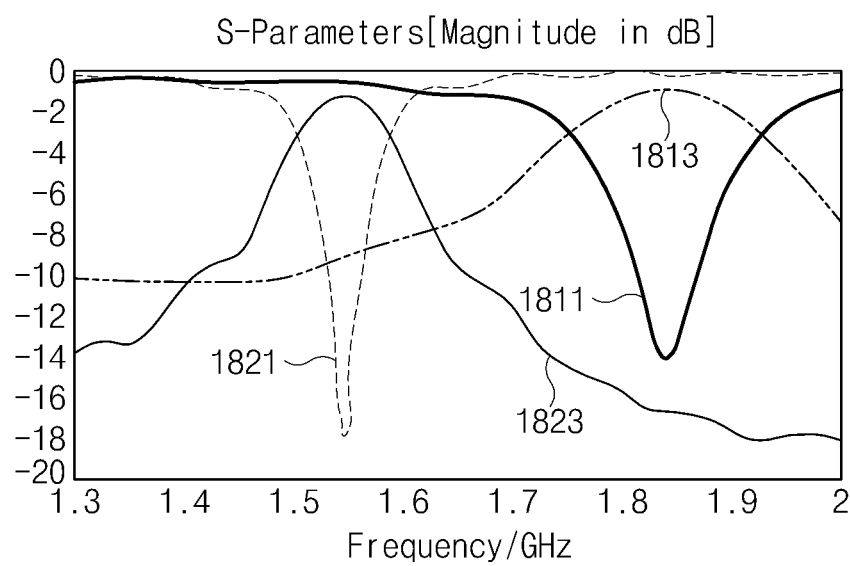
FIG. 18 is a diagram performance of an antenna, according to an embodiment.

FIG. 18 is a diagram of performance of an antenna, according to an embodiment.

FIG. 18 shows a transfer characteristic and a reflection characteristic of an antenna in a mid band (e.g., a 1.5 GHz band (B3) or a 1.8 GHz band (B1)) when a PPW metal pattern is used and when a conductive patch layer (e.g., the conductive patch layer 920 of FIG. 9) of a regular pattern is placed.

Referring to FIG. 18, when the regular pattern is used, in the mid band, a PPW characteristic frequency may be down-shifted and may be out of the band.

A first line 1811 and a second line 1813 indicate the transfer characteristic and the reflection characteristic of the antennas when using the PPW metal pattern, and a third line 1821 and a fourth line 1823 indicate the transfer characteristic and the reflection characteristic of the antennas when using the regular pattern.

It may be understood from the first line 1811 and the third line 1821 that a standing wave oscillates in a 1.85 GHz band when using the PPW metal pattern and oscillates in a 1.55 GHz band when using the regular pattern. As such, a frequency band of the standing wave may be down-shifted upon using the regular pattern, and a band cutoff characteristic may be secured in a band such as B1 or B3 by using a PPW filter structure.

Referring to FIGS. 10 to 18, a transmission power may be prevented from being leaked due to the PPW transmission line through the structures of the electronic device described with reference to FIGS. 7A to FIG. 9. Accordingly, radiation performance of the antenna may be recovered, and high radiation efficiency may be secured. According to the electronic device described with reference to FIGS. 7A to 9, radiation performance may be improved through a standing wave frequency shift. Meanwhile, the radiation performance of the antenna may be improved by removing a PPW transmission characteristic.

Figure 19:
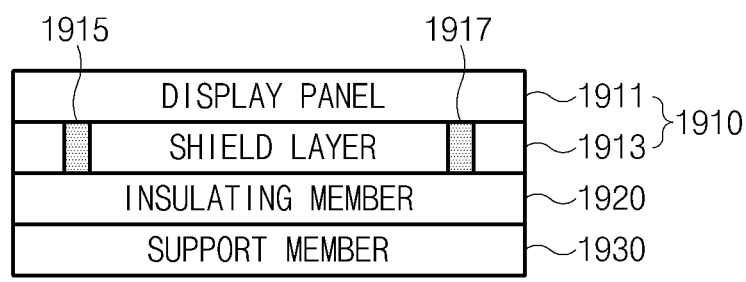
FIG. 19 is a diagram of a stacked structure of an electronic device, according to an embodiment.

FIG. 19 is a diagram of a stacked structure of an electronic device, according to an embodiment.

Referring to FIG. 19, an electronic device 1900 (e.g., the electronic device 100 of FIGS. 1 and 2) may include a display 1910, an insulating member 1920, and a support member 1930. The display 1910 may include a display panel 1911 and a shield layer 1913. The display 1910, the insulating member 1920, and the support member 1930 of FIG. 19 are identical or similar to the display 510, the insulating member 530, and the support member 540 of FIG. 5.

At least one slit 1915 or 1917 may be formed for the purpose of removing the PPW transmission characteristic. The slit 1915 or 1917 which is an elongated slit may be formed at the shield layer 1913.

Figure 20:
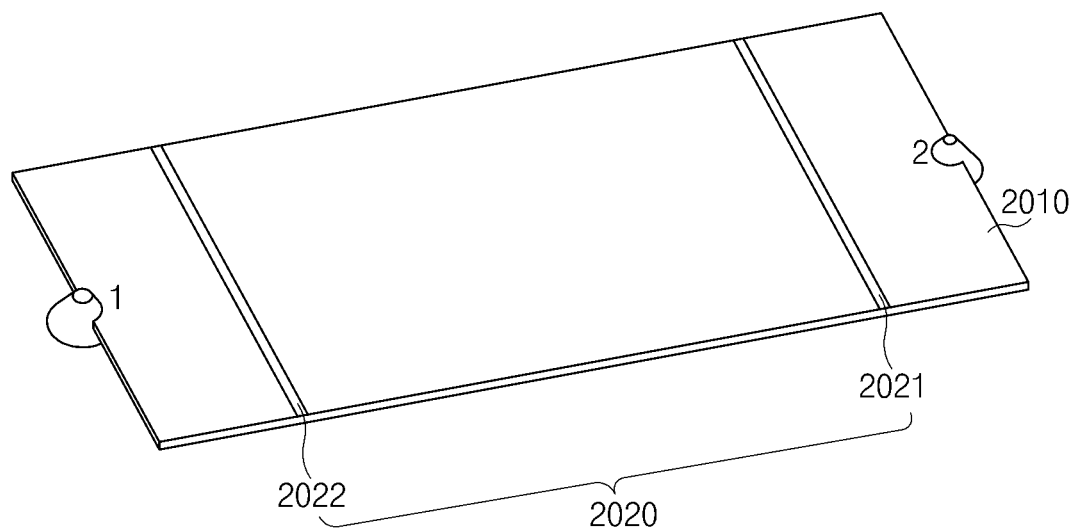
FIG. 20 is a diagram of a display, according to an embodiment.

FIG. 20 is a diagram of a display, according to an embodiment.

Referring to FIG. 20, a slit 2020 (e.g., the slit 1915 or 1917 of FIG. 19) may be formed at a display 2010 (e.g., the display 1910 of FIG. 19). At least one slit 2021 or 2022 may be formed on a metal surface (e.g., the shield layer 1913) of the display 2010, which is positioned parallel to a support member (e.g., the support member 1930 of FIG. 19).

The metal surface of the display 2010 may be divided into two or more regions by the slit 2020. The slit 2020 may include a region in which a conductive metal region is removed. The slit 2020 may be a non-conductive region which is defined by removing a portion of the metal surface of the display 2010. The slit 2020 may be filled with air or may be filled with a medium having an electrical characteristic such as permittivity and permeability.

Figure 21:
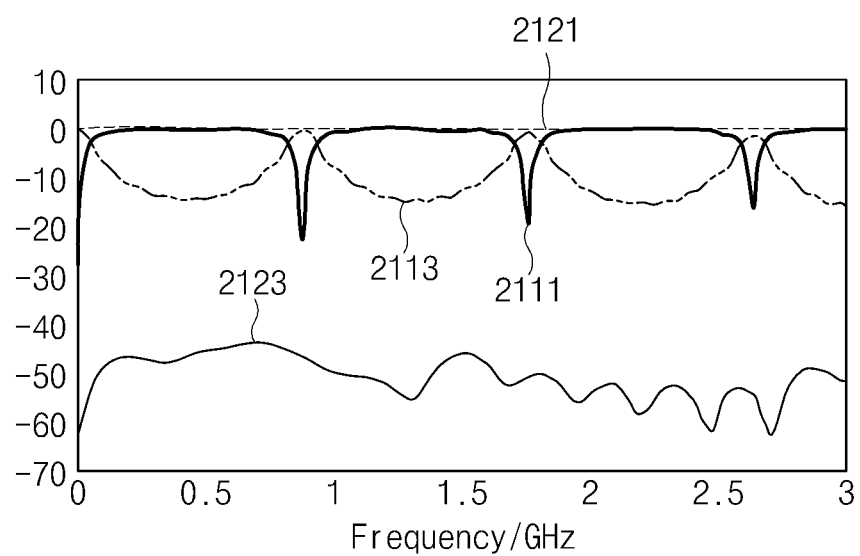
FIG. 21 is a diagram of performance of an antenna, according to an embodiment.

FIG. 21 is a diagram of performance of an antenna, according to an embodiment.

Referring to FIG. 21, when a slit is formed on a metal surface (e.g., the shield layer 1913) of a display (e.g., the display 2010 of FIG. 20), a PPW transmission line cannot be constructed, and thus, radiation performance of an antenna may be improved. At the shield layer 1913 and the support member 1930 of FIG. 19, a 2-port PPW equivalent circuit structure as illustrated in FIGS. 3A and 3B may be formed by an antenna feeder. A first port and a second port of FIGS. 3A and 3B may be respectively marked by "1" and "2" in FIG. 20.

A first line 2111 and a second line 2113 indicate a transfer characteristic and a reflection characteristic of an antennas when using a PPW metal pattern, and a third line 2121 and a fourth line 2123 indicate the transfer characteristic and the reflection characteristic of the antennas when a slit is formed at a display.

Referring to the first line 2111 and the third line 2121, a standing wave oscillates when using the PPW metal pattern, but does not oscillate when the slit is formed at the display. A PPW transmission line may not be constructed by forming a slit at a display such that a metal surface of the display is physically divided, and the antenna may have a band cut-off characteristic (S21) of −40 dB or lower as understood from the fourth line 2123.

A parasitic current may flow from the first port to the second port in the 2-port PPW equivalent circuit structure. However, in the case where a slit exists, the transfer characteristic (S21) of the antenna may decrease to −40 dB or lower, and thus, a current cannot flow. Since the PPW transmission line itself is not constructed, a parasitic current may not be generated, and radiation deterioration due to the parasitic current may not occur. Accordingly, a radiation characteristic may be improved.

Figure 22:
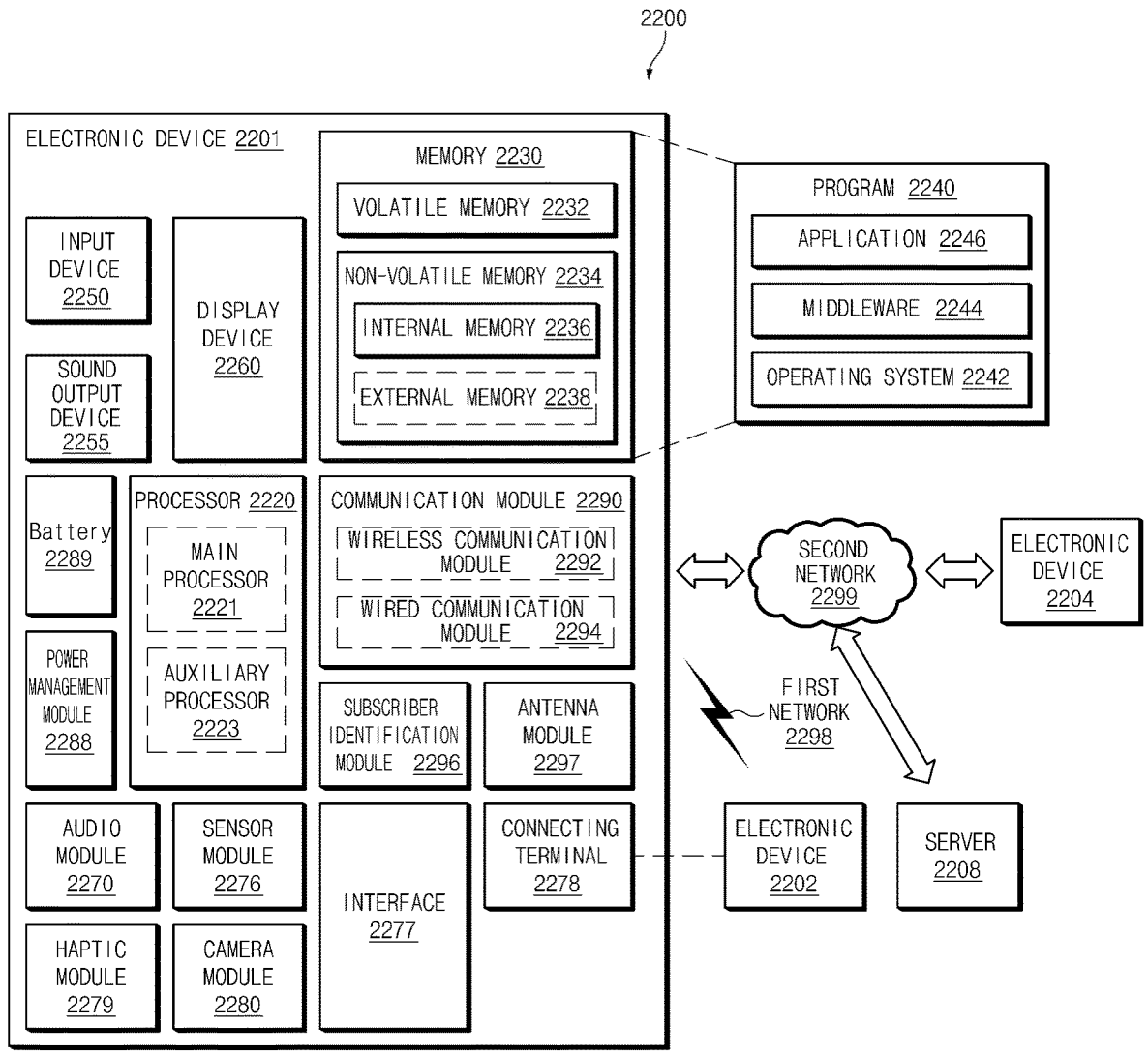
FIG. 22 is a diagram of an electronic device in a network environment, according to an embodiment.

FIG. 22 is a block diagram illustrating an electronic device 2201 in a network environment 2200 according to various embodiments. Referring to FIG. 22, the electronic device 2201 in the network environment 2200 may communicate with an electronic device 2202 via a first network 2298 (e.g., a short-range wireless communication network), or an electronic device 2204 or a server 2208 via a second network 2299 (e.g., a long-range wireless communication network). According to an embodiment, the electronic device 2201 may communicate with the electronic device 2204 via the server 2208. According to an embodiment, the electronic device 2201 may include a processor 2220, memory 2230, an input device 2250, a sound output device 2255, a display device 2260, an audio module 2270, a sensor module 2276, an interface 2277, a haptic module 2279, a camera module 2280, a power management module 2288, a battery 2289, a communication module 2290, a subscriber identification module (SIM) 2296, or an antenna module 2297. In some embodiments, at least one (e.g., the display device 2260 or the camera module 2280) of the components may be omitted from the electronic device 2201, or one or more other components may be added in the electronic device 2201. In some embodiments, some of the components may be implemented as single integrated circuitry. For example, the sensor module 2276 (e.g., a fingerprint sensor, an iris sensor, or an illuminance sensor) may be implemented as embedded in the display device 2260 (e.g., a display).

The processor 2220 may execute, for example, software (e.g., a program 2240) to control at least one other component (e.g., a hardware or software component) of the electronic device 2201 coupled with the processor 2220, and may perform various data processing or computation. According to one embodiment, as at least part of the data processing or computation, the processor 2220 may load a command or data received from another component (e.g., the sensor module 2276 or the communication module 2290) in volatile memory 2232, process the command or the data stored in the volatile memory 2232, and store resulting data in non-volatile memory 2234. According to an embodiment, the processor 2220 may include a main processor 2221 (e.g., a central processing unit (CPU) or an AP), and an auxiliary processor 2223 (e.g., a graphics processing unit (GPU), an image signal processor (ISP), a sensor hub processor, or a CP) that is operable independently from, or in conjunction with, the main processor 2221. Additionally or alternatively, the auxiliary processor 2223 may be adapted to consume less power than the main processor 2221, or to be specific to a specified function. The auxiliary processor 2223 may be implemented as separate from, or as part of the main processor 2221.

The auxiliary processor 2223 may control at least some of functions or states related to at least one component (e.g., the display device 2260, the sensor module 2276, or the communication module 2290) among the components of the electronic device 2201, instead of the main processor 2221 while the main processor 2221 is in an inactive (e.g., sleep) state, or together with the main processor 2221 while the main processor 2221 is in an active state (e.g., executing an application). According to an embodiment, the auxiliary processor 2223 (e.g., an image signal processor or a communication processor) may be implemented as part of another component (e.g., the camera module 2280 or the communication module 2290) functionally related to the auxiliary processor 2223.

The memory 2230 may store various data used by at least one component (e.g., the processor 2220 or the sensor module 2276) of the electronic device 2201. The various data may include, for example, software (e.g., the program 2240) and input data or output data for a command related thereto. The memory 2230 may include the volatile memory 2232 or the non-volatile memory 2234.

The program 2240 may be stored in the memory 2230 as software, and may include, for example, an operating system (OS) 2242, middleware 2244, or an application 2246.

The input device 2250 may receive a command or data to be used by other component (e.g., the processor 2220) of the electronic device 2201, from the outside (e.g., a user) of the electronic device 2201. The input device 2250 may include, for example, a microphone, a mouse, a keyboard, or a digital pen (e.g., a stylus pen).

The sound output device 2255 may output sound signals to the outside of the electronic device 2201. The sound output device 2255 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 2260 may visually provide information to the outside (e.g., a user) of the electronic device 2201. The display device 2260 may include, for example, a display, a hologram device, or a projector and control circuitry to control a corresponding one of the display, hologram device, and projector. According to an embodiment, the display device 2260 may include touch circuitry adapted to detect a touch, or sensor circuitry (e.g., a pressure sensor) adapted to measure the intensity of force incurred by the touch.

The audio module 2270 may convert a sound into an electrical signal and vice versa. According to an embodiment, the audio module 2270 may obtain the sound via the input device 2250, or output the sound via the sound output device 2255 or a headphone of an external electronic device (e.g., an electronic device 2202) directly (e.g., wiredly) or wirelessly coupled with the electronic device 2201.

The sensor module 2276 may detect an operational state (e.g., power or temperature) of the electronic device 2201 or an environmental state (e.g., a state of a user) external to the electronic device 2201, and then generate an electrical signal or data value corresponding to the detected state. According to an embodiment, the sensor module 2276 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 2277 may support one or more specified protocols to be used for the electronic device 2201 to be coupled with the external electronic device (e.g., the electronic device 2202) directly (e.g., wiredly) or wirelessly. According to an embodiment, the interface 2277 may include, for example, a high definition multimedia interface (HDMI), a universal serial bus (USB) interface, a secure digital (SD) card interface, or an audio interface.

A connecting terminal 2278 may include a connector via which the electronic device 2201 may be physically connected with the external electronic device (e.g., the electronic device 2202). According to an embodiment, the connecting terminal 2278 may include, for example, a HDMI connector, a USB connector, a SD card connector, or an audio connector (e.g., a headphone connector).

The haptic module 2279 may convert an electrical signal into a mechanical stimulus (e.g., a vibration or a movement) or electrical stimulus which may be recognized by a user via his tactile sensation or kinesthetic sensation. According to an embodiment, the haptic module 2279 may include, for example, a motor, a piezoelectric element, or an electric stimulator.

The camera module 2280 may capture a still image or moving images. According to an embodiment, the camera module 2280 may include one or more lenses, image sensors, image signal processors, or flashes.

The power management module 2288 may manage power supplied to the electronic device 2201. According to one embodiment, the power management module 2288 may be implemented as at least part of, for example, a power management integrated circuit (PMIC).

The battery 2289 may supply power to at least one component of the electronic device 2201. According to an embodiment, the battery 2289 may include, for example, a primary cell which is not rechargeable, a secondary cell which is rechargeable, or a fuel cell.

The communication module 2290 may support establishing a direct (e.g., wired) communication channel or a wireless communication channel between the electronic device 2201 and the external electronic device (e.g., the electronic device 2202, the electronic device 2204, or the server 2208) and performing communication via the established communication channel The communication module 2290 may include one or more communication processors that are operable independently from the processor 2220 (e.g., the AP) and supports a direct (e.g., wired) communication or a wireless communication. According to an embodiment, the communication module 2290 may include a wireless communication module 2292 (e.g., a cellular communication module, a short-range wireless communication module, or a global navigation satellite system (GNSS) communication module) or a wired communication module 2294 (e.g., a local area network (LAN) communication module or a power line communication (PLC) module). A corresponding one of these communication modules may communicate with the external electronic device via the first network 2298 (e.g., a short-range communication network, such as Bluetooth™, wireless-fidelity (Wi-Fi) direct, or Infrared Data Association (IrDA)) or the second network 2299 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 2292 may identify and authenticate the electronic device 2201 in a communication network, such as the first network 2298 or the second network 2299, using subscriber information (e.g., international mobile subscriber identity (IMSI)) stored in the subscriber identification module 2296.

The antenna module 2297 may transmit or receive a signal or power to or from the outside (e.g., the external electronic device) of the electronic device 2201. According to an embodiment, the antenna module 2297 may include an antenna including a radiating element composed of a conductive material or a conductive pattern formed in or on a substrate (e.g., PCB). According to an embodiment, the antenna module 2297 may include a plurality of antennas. In such a case, at least one antenna appropriate for a communication scheme used in the communication network, such as the first network 2298 or the second network 2299, may be selected, for example, by the communication module 2290 (e.g., the wireless communication module 2292) from the plurality of antennas. The signal or the power may then be transmitted or received between the communication module 2290 and the external electronic device via the selected at least one antenna. According to an embodiment, another component (e.g., a radio frequency integrated circuit (RFIC)) other than the radiating element may be additionally formed as part of the antenna module 2297.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 2201 and the external electronic device 2204 via the server 2208 coupled with the second network 2299. Each of the electronic devices 2202 and 2204 may be a device of a same type as, or a different type, from the electronic device 2201. All or some of operations to be executed at the electronic device 2201 may be executed at one or more of the external electronic devices 2202, 2204, or 2208. For example, if the electronic device 2201 should perform a function or a service automatically, or in response to a request from a user or another device, the electronic device 2201, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 2201. The electronic device 2201 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 2240) including one or more instructions that are stored in a storage medium (e.g., internal memory 2236 or external memory 2238) that is readable by a machine (e.g., the electronic device 2201). For example, a processor (e.g., the processor 2220) of the machine (e.g., the electronic device 2201) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to certain embodiments thereof, it will be understood by those skilled in the art that various changes in form and details may be made therein without departing from the scope of the disclosure. Therefore, the scope of the disclosure should not be defined as being limited to the embodiments, but should be defined by the appended claims and equivalents thereof.

What is claimed is:

1. An electronic device comprising:
    a housing including a front plate, a rear plate facing away from the front plate, and a side member surrounding a space between the front plate and the rear plate, wherein at least a portion of the side member is formed of an electrically conductive material;
    a display positioned in the space between the front plate and the rear plate, the display including a first conductive layer parallel to the front plate;
    a conductive structure interposed between the display and the rear plate, the conductive structure including a second conductive layer parallel to the first conductive layer and overlapping at least partially with the first conductive layer when viewed from above the front plate;
    a printed circuit board interposed between the conductive structure and the rear plate;
    a wireless communication circuit positioned on the printed circuit board and electrically connected with a portion of the side member; and
    a conductive patch layer interposed between the first conductive layer and the second conductive layer, wherein at least one portion of the conductive patch layer is extended along the portion of the side member in a first direction or in a second direction perpendicular to the first direction.

2. The electronic device of claim 1, wherein the patch layer is attached to the second conductive layer.

3. The electronic device of claim 1, wherein the patch layer is electrically isolated from at least one of the first conductive layer or the second conductive layer.

4. The electronic device of claim 1, wherein the patch layer is formed of copper.

5. The electronic device of claim 1, wherein the second conductive layer includes an opening,
    wherein the electronic device further comprises a battery partially positioned in the opening, and
    wherein the patch layer is extended in the first direction across the opening.

6. The electronic device of claim 1, wherein the patch layer includes:
    a first portion extended in the first direction; and
    a second portion extended from one end of the first portion in the second direction.

7. The electronic device of claim 6, wherein the patch layer further includes:
    a third portion extended from another end of the first portion in the second direction.

8. The electronic device of claim 1, wherein the patch layer is extended along an edge of the second conductive layer.

9. The electronic device of claim 1, wherein the patch layer includes patterns arranged regularly.

10. The electronic device of claim 1, further comprising:
    an insulating member interposed between the first conductive layer and the second conductive layer,
    wherein the insulating member does not overlap with the patch layer when viewed from above the front plate.

11. The electronic device of claim 10, wherein the insulating member has permittivity or permeability.

12. The electronic device of claim 11, wherein the insulating member includes a highly-resistant (HR) tape.

13. The electronic device of claim 1, wherein the first conductive layer is formed of copper.

14. The electronic device of claim 1, wherein the side member includes two or more regions, which are physically spaced from each other and are formed of an electrically conductive material.

15. The electronic device of claim 14, wherein the wireless communication circuit is electrically connected to the two or more regions formed of an electrically conductive material.

16. An electronic device comprising:
    a housing including a front plate, a rear plate facing away from the front plate, and a side member surrounding a space between the front plate and the rear plate, the housing including at least one antenna element extended along one portion of the side member;

a display exposed through the front plate and including a display panel and a shield layer;
a wireless communication circuit electrically connected to the antenna element;
a support member, at least a portion of which is positioned in the space in parallel with the shield layer; and
a conductive patch layer interposed between the shield layer and the support member.

17. The electronic device of claim 16, wherein the conductive patch layer is electrically connected to the shield layer or the support member.

18. The electronic device of claim 16, wherein the conductive patch layer is electrically isolated from at least one of the support member and the shield layer.

19. The electronic device of claim 16, wherein the support member includes an opening formed to be spaced from the antenna element.

20. The electronic device of claim 19, further comprising:
a battery,
wherein the opening is formed to correspond to a size of the battery.

\* \* \* \* \*